(12) United States Patent
Lee et al.

(10) Patent No.: US 8,994,467 B2
(45) Date of Patent: Mar. 31, 2015

(54) METHOD AND APPARATUS FOR MEASURING/COMPENSATING MISMATCHES IN DIGITALLY-CONTROLLED OSCILLATOR

(71) Applicant: MediaTek Singapore Pte. Ltd., Singapore (SG)

(72) Inventors: Wen-Chang Lee, Taipei (TW); Shih-Chi Shen, New Taipei (TW); Chii-Horng Chen, Taichung (TW); Xiaochuan Guo, Austin, TX (US)

(73) Assignee: MediaTek Singapore Pte. Ltd., Singapore (SG)

( * ) Notice: Subject to any disclaimer, the term of this patent is extended or adjusted under 35 U.S.C. 154(b) by 96 days.

(21) Appl. No.: 13/794,774

(22) Filed: Mar. 11, 2013

(65) Prior Publication Data
US 2013/0265114 A1    Oct. 10, 2013

Related U.S. Application Data

(60) Provisional application No. 61/620,902, filed on Apr. 5, 2012.

(51) Int. Cl.
| | | |
|---|---|---|
| *H03B 5/08* | (2006.01) | |
| *H03L 7/095* | (2006.01) | |
| *H03L 7/093* | (2006.01) | |
| *H03L 7/099* | (2006.01) | |
| *H03B 1/00* | (2006.01) | |
| *H03L 7/197* | (2006.01) | |

(52) U.S. Cl.
CPC . *H03L 7/095* (2013.01); *H03B 1/00* (2013.01); *H03L 7/093* (2013.01); *H03L 7/099* (2013.01); *H03L 7/1976* (2013.01); *H03L 2207/50* (2013.01)
USPC ............... 331/167; 331/117 R; 331/117 FE

(58) Field of Classification Search
CPC ................................. H03L 7/095; H03B 1/00
USPC ......... 331/117 R, 117 FE, 167, 1 A; 327/156, 327/159
See application file for complete search history.

(56) References Cited

U.S. PATENT DOCUMENTS

| | | |
|---|---|---|
| 6,734,741 B2 | 5/2004 | Staszewski |
| 2010/0188158 A1* | 7/2010 | Ainspan et al. ............... 331/1 A |
| 2011/0148676 A1* | 6/2011 | Waheed et al. ............... 341/131 |

OTHER PUBLICATIONS

Eliezer, Accurate Self-Characterization of Mismatches in Capacitor Array of a Digitally-Controlled Oscillator, pp. 1-4, Circuits and Systems Workshop (DCAS), 2010 IEEE Dallas.
Cao, Title: Time-To-Digital Converter, pending U.S. Appl. No. 13/450,263, filed Apr. 18, 2012.

* cited by examiner

*Primary Examiner* — Arnold Kinkead
(74) *Attorney, Agent, or Firm* — Winston Hsu; Scott Margo

(57) ABSTRACT

A digitally-controlled oscillator (DCO) includes a first capacitor array and a second capacitor array responsive to an integer part and a fractional part of a digital control word, respectively. The mismatch measurement of the DCO includes a first settling phase and a second settling phase. In the first settling phase, the first capacitor array is fixed to have one capacitive value, and the second capacitor array is adjusted for making the DCO frequency locked to a target value. In the second settling phase, the first capacitor array is fixed to have another capacitive value, and the second capacitor array is adjusted for making the DCO frequency locked to the same target value. The capacitor mismatches are estimated according to characteristic values derived from the digital control word adaptively adjusted in the first setting phase and the second setting phase.

20 Claims, 13 Drawing Sheets

METHOD AND APPARATUS FOR MEASURING/COMPENSATING MISMATCHES IN DIGITALLY-CONTROLLED OSCILLATOR

CROSS REFERENCE TO RELATED APPLICATIONS

The application claims the benefit of U.S. provisional application No. 61/620,902, filed on Apr. 5, 2012 and incorporated herein by reference.

BACKGROUND

The disclosed embodiments of the present invention relate to a digitally-controlled oscillator, and more particularly, to a method and an apparatus for measuring/compensating mismatches in a digitally-controlled oscillator.

A phase-locked loop (PLL) is an electronic control system that generates a signal that has a fixed relation to the phase of a reference signal. A PLL responds to both the frequency and the phase of the input signals, and automatically raises or lowers the frequency of a controlled oscillator until it is matched to the reference signal in both frequency and phase. As known by those skilled in the art, the performance of analog phase-locked loop (PLL) is getting worse with process scaling due to the less available voltage headroom, making all-digital phase-locked loop (ADPLL) prevails. Additionally, ADPLL may significantly help in area reduction and process migration. For example, a digital-controlled oscillator (DCO) may be used for replacing the conventionally used voltage-controlled oscillator (VCO) which is an analog element. A phase detector may also be replaced with a time-to-digital converter (TDC). Therefore, the usage of the ADPLL is becoming a trend in radio communications. For example, the ADPLL may be used in a direct frequency modulation (DFM) based transmitter such as a digital polar transmitter. Therefore, the capacitor mismatch in a tracking capacitor array of the DCO plays a crucial role in the transmitter (TX) modulation performance such as output radio frequency spectrum (ORFS). Besides, the systematic mismatch between integer and fractional tracking capacitors can also degrade ORFS.

There is thus a need for a built-in DCO self-calibration mechanism that is capable of measuring and compensating mismatches (e.g., capacitor mismatch and systematic mismatch) in the DCO without lengthy processing time.

SUMMARY

In accordance with exemplary embodiments of the present invention, a method and an apparatus for measuring/compensating mismatches in a digitally-controlled oscillator are proposed to solve the above-mentioned problems.

According to a first aspect of the present invention, an exemplary method for measuring mismatches in a digitally-controlled oscillator (DCO) is disclosed. The exemplary method includes: performing at least one measurement operation, and estimating the mismatches according to at least an estimation value derived from a difference value generated from the at least one measurement operation. Each measurement operation includes: in a first settling phase, controlling a first capacitor array of the DCO to have a first capacitive value consistently, and controlling a second capacitor array of the DCO in a closed loop to make a frequency of the DCO locked to a target value, wherein the first capacitor array is responsive to an integer part of a digital control word, and the second capacitor array is responsive to a fractional part of the digital control word; in a second settling phase, controlling the first capacitor array to have a second capacitive value consistently, and controlling the second capacitor array in the closed loop to make the frequency of the DCO locked to the target value, wherein the second capacitive value is different from the first capacitive value; and deriving the estimation value from the difference value between a first characteristic value and a second characteristic value, wherein the first characteristic value is derived from the digital control word adaptively adjusted in the first settling phase, and the second characteristic value is derived from the digital control word adaptively adjusted in the second settling phase; and.

According to a second aspect of the present invention, an exemplary method for compensating a digitally-controlled oscillator (DCO) for mismatches is disclosed. The DCO includes a first capacitor array responsive to an integer part of a digital control word and a second capacitor array responsive to a fractional part of the digital control word. The method includes: determining a first compensation value according to the integer part; and adjusting the fractional part according to the first compensation value and a second compensation value such that an accumulated capacitor mismatch of selected capacitors in the first capacitor array that are enabled by the integer part is compensated due to the first compensation value, and a systematic mismatch between capacitors in the first capacitor array and capacitors in the second capacitor array is compensated due to the second compensation value.

According to a third aspect of the present invention, an exemplary method for controlling a digitally-controlled oscillator (DCO) is disclosed. The exemplary method includes: receiving a control value derived from a fractional part of a digital control word; performing a sigma-delta modulation (SDM) upon the control value to generate an SDM output; and utilizing a dynamic element matching (DEM) circuit to transmit the SDM output to a capacitor array of the DCO.

According to a fourth aspect of the present invention, an exemplary measurement apparatus for measuring mismatches of a digitally-controlled oscillator (DCO) is disclosed. The exemplary measurement apparatus includes a measuring circuit and an estimating circuit. The measuring circuit is arranged for performing at least one measurement operation. Each measurement operation includes: in a first settling phase, controlling a first capacitor array of the DCO to have a first capacitive value consistently, and controlling a second capacitor array of the DCO in a closed loop to make a frequency of the DCO locked to a target value, wherein the first capacitor array is responsive to an integer part of a digital control word, and the second capacitor array is responsive to a fractional part of the digital control word; in a second settling phase, controlling the first capacitor array to have a second capacitive value consistently, and controlling the second capacitor array in the closed loop to make the frequency of the DCO locked to the target value, wherein the second capacitive value is different from the first capacitive value; and deriving an estimation value from a difference value between a first characteristic value and a second characteristic value, wherein the first characteristic value is derived from the digital control word adaptively adjusted in the first settling phase, and the second characteristic value is derived from the digital control word adaptively adjusted in the second settling phase. The estimating circuit is arranged for estimating the mismatches according to at least the estimation value generated from the at least one measurement operation performed by the measuring circuit.

According to a fifth aspect of the present invention, an exemplary compensation apparatus for compensating a digitally-controlled oscillator (DCO) for mismatches is disclosed. The DCO includes a first capacitor array responsive to an integer part of a digital control word and a second capacitor array responsive to a fractional part of the digital control word. The compensation apparatus includes a processing circuit and a compensating circuit. The processing circuit is arranged for determining a first compensation value according to the integer part. The compensating circuit is arranged for adjusting the fractional part according to the first compensation value and a second compensation value such that an accumulated capacitor mismatch of selected capacitors in the first capacitor array that are enabled by the integer part is compensated due to the first compensation value, and a systematic mismatch between capacitors in the first capacitor array and capacitors in the second capacitor array is compensated due to the second compensation value.

According to a sixth aspect of the present invention, an exemplary digital peripheral apparatus of a digitally-controlled oscillator (DCO) is disclosed. The exemplary digital peripheral apparatus includes a sigma-delta modulator and a dynamic element matching (DEM) circuit. The sigma-delta modulator is arranged for receiving a control value derived from a fractional part of a digital control word, and performing a sigma-delta modulation (SDM) upon the control value to generate an SDM output. The DEM circuit is arranged for transmitting the SDM output to a capacitor array of the DCO.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

The main concept of the present invention is to use fractional capacitors to characterize/estimate and compensate for the capacitor mismatch (i.e., mismatch of the DCO gain $K_{DCO}$) and the systematic mismatch between fractional and integer capacitors. As the mismatches are measured in terms of the fractional capacitor unit size, the measurement resolution is increased. For example, the fractional capacitors in a tracking capacitor array are controlled according to a fractional part of a digital control word. If the fractional part has N bits, the theoretical measurement resolution is 0.2% (i.e., $1/(2^N-1)$). Besides the improved measurement resolution, the proposed measurement scheme is capable of measuring all tracking capacitors used for TX modulation in a short period of time (e.g., ~10 ms). The TX modulation performance of a DFM-based transmitter can be improved by compensating the DCO for undesired mismatches more accurately and quickly. Thus, the present invention is capable of achieving a nearly perfect matched DCO without noise penalty. Further details are described as below.

Figure 1:
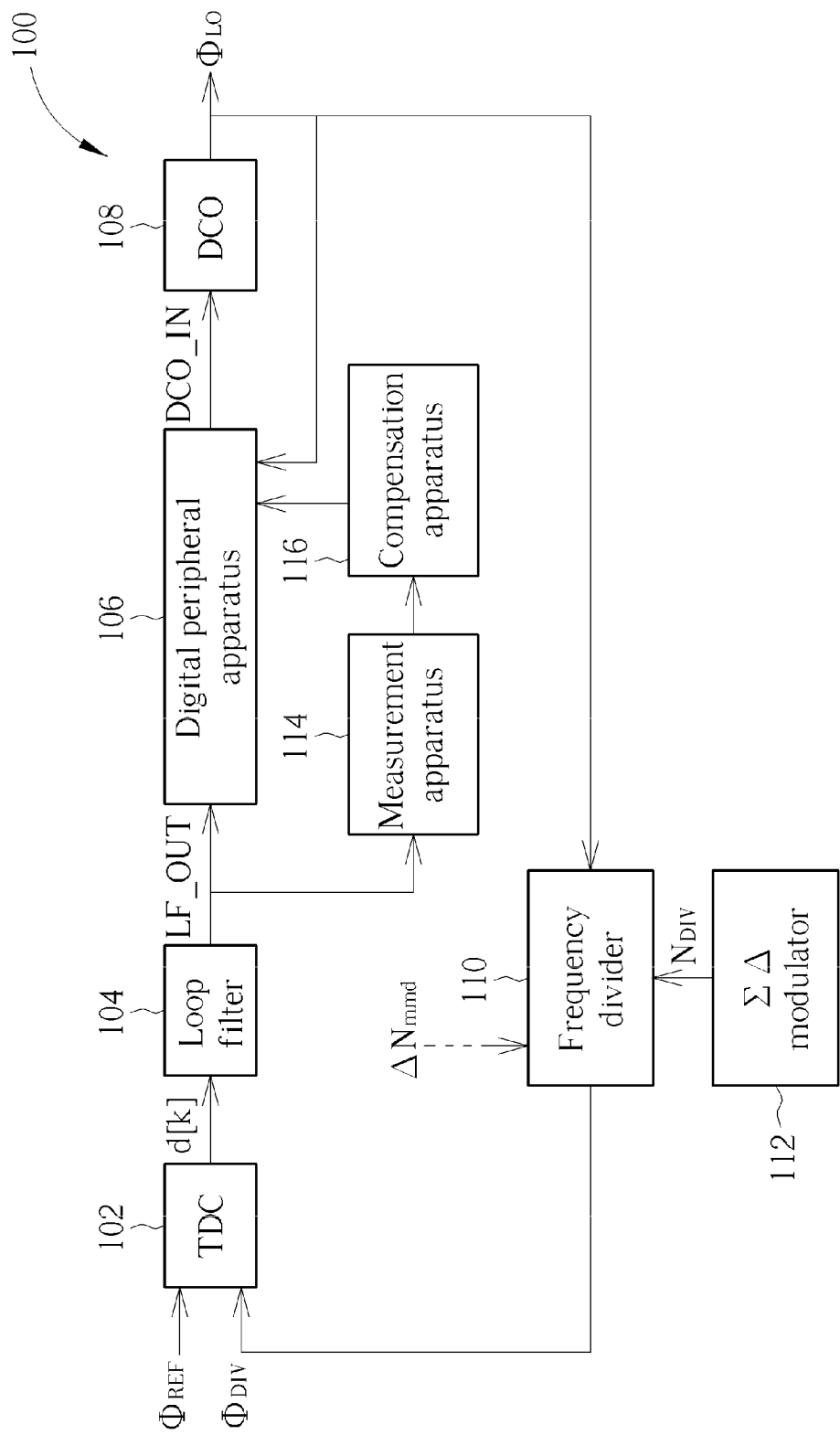
FIG. 1 is a block diagram illustrating an ADPLL using a proposed measurement and compensation scheme according to an embodiment of the present invention.

FIG. 1 is a block diagram illustrating an ADPLL using a proposed measurement and compensation scheme according to an embodiment of the present invention. By way of example, the ADPLL 100 may be employed in a DFM based transmitter such as a polar transmitter. The ADPLL 100 includes a TDC 102, a loop filter 104, a digital peripheral apparatus 106, a DCO 108, a frequency divider 110, a sigma-delta modulator 112, a measurement apparatus 114, and a compensation apparatus 116. The DCO 108 generates an oscillating signal with phase $\Phi_{LO}$. The oscillating signal is processed by the frequency divider 110 to generate a frequency-divided signal with phase $\Phi_{DIV}$, where the frequency divisor $N_{DIV}$ is set by the sigma-delta modulator 112. The TDC 102 compares a reference phase $\Phi_{REF}$ with $\Phi_{DIV}$, and generates a phase error d[k] to the loop filter 104. The loop filter 104 generates a filter output LF_OUT to the digital peripheral apparatus 106 of the DCO 108 in response to the phase error d[k]. The digital peripheral apparatus 106 is operative to convert the filter output LF_OUT into a DCO control input DCO_IN, wherein the filter output LF_OUT acts as a digital control word having an integer part and a fractional part. The DCO frequency is responsive to the DCO control input DCO_IN. Specifically, the DCO control input DCO_IN is used for controlling capacitor arrays (i.e., varactor arrays) in the DCO 108. As mentioned above, capacitors of the DCO 108 have mismatches such as capacitor mismatch and systematic mismatch. The present invention therefore proposes a built-in self-calibration mechanism implemented using the measurement apparatus 114 and the compensation apparatus 116. The measurement apparatus 114 is arranged to measure mismatches in the DCO 108, and the compensation apparatus 116 is arranged to compensate the DCO 108 for the mismatches estimated by the measurement apparatus 114.

Figure 2:
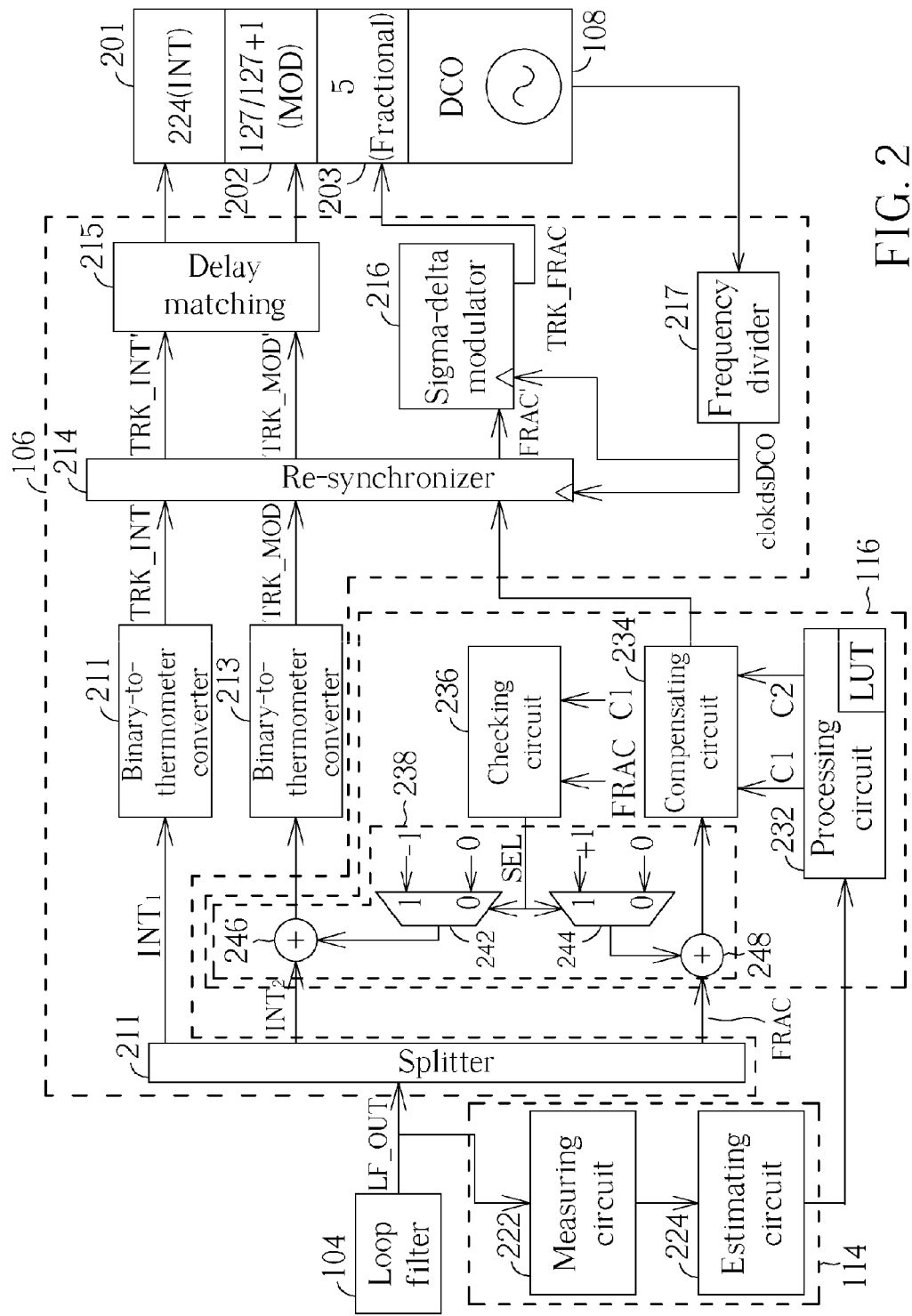
FIG. 2 is a diagram illustrating an exemplary implementation of part of the ADPLL shown in FIG. 1.

Please refer to FIG. 2, which is a diagram illustrating an exemplary implementation of part of the ADPLL 100 shown in FIG. 1. As shown in FIG. 2, the DCO 108 has a plurality of tracking capacitors. Ideally, all of the tracking capacitors should have the same capacitance value. However, the tracking capacitors are not perfectly matched, and thus require mismatch compensation. In this embodiment, the capacitor array 201 has 224 tracking capacitors used for frequency synthesis, the capacitor array 202 has 127 (or 127+1) tracking capacitors used for TX modulation, and the capacitor array 203 has 5 tracking capacitors used for frequency synthesis and TX modulation. Specifically, when the ADPLL 100 is operated in the frequency synthesis mode, the number of enabled capacitors in the capacitor array 202 is fixed, and the number of enabled capacitors in the capacitor array 201 and the number of enabled capacitors in the capacitor array 203 are both adjustable, where the capacitor array 201 is responsive to an integer part $INT_1$ of a digital control word (i.e., the filter output LF_OUT), and the capacitor array 203 is responsive to a fractional part FRAC of the digital control word (i.e., the filter output LF_OUT). When the ADPLL 100 is operated in the TX modulation mode, the number of enabled capacitors in the capacitor array 201 is fixed, and the number of enabled capacitors in the capacitor array 202 and the number of enabled capacitors in the capacitor array 203 are both adjustable, where the capacitor array 202 is responsive to an integer part $INT_2$ of a digital control word (i.e., the filter output LF_OUT), and the capacitor array 203 is responsive to a fractional part FRAC of the digital control word (i.e., the filter output LF_OUT). It should be noted that the number of tracking capacitors used in the DCO 108 is for illustrative purposes only, and is not meant to be a limitation of the present invention. Besides, only tracking capacitors pertinent to the present invention are shown in FIG. 2 for simplicity. Actually, the DCO 108 may have other capacitor arrays, such as a switching capacitor array (SCA).

As shown in FIG. 2, the digital peripheral apparatus 106 includes a splitter 211, a plurality of binary-to-thermometer converters 212, 213, a re-synchronizer 214, a delay matching circuit 215, a sigma-delta modulator 216, and a frequency divider 217. The splitter 211 is arranged to split the filter output LF_OUT into an integer part $INT_1/INT_2$ and a fractional part FRAC. The binary-to-thermometer converter 212/213 is arranged to convert the integer part $INT_1/INT_2$, which is a binary code, into an integer part TRK_INT/TRK_MOD, which is a thermometer code. The DCO clock is processed by the frequency divider 217, and a frequency-divided clock clkdsDCO is generated to the re-synchronizer 214 and the sigma-delta modulator 216. The re-synchronizer 214 synchronizes the incoming integer part TRK_INT/MOD_INT and fractional part FRAC under the timing control of the frequency-divided clock clkdsDCO, and outputs synchronized integer part TRK_INT'/MOD_INT' and fractional part FRAC'. The sigma-delta modulator 216 is arranged to perform a sigma-delta modulation (SDM) upon the fractional part FRAC' under the timing control of the frequency-divided clock clkdsDCO, and accordingly generate an SDM output TRK_FRAC. The delay matching circuit 215 is arranged to delay the integer part TRK_INT'/TRK_MOD' generated from the preceding re-synchronizer 214 such that the integer part TRK_INT'/TRK_MOD' and the SDM output TRK_FRAC arrive at the DCO 108 simultaneously. As can be seen from FIG. 2, the capacitor array 201 is responsive to the integer part TRK_INT', the capacitor array 202 is responsive to the integer part MOD_INT', and the capacitor array 203 is responsive to the SDM output TRK_FRAC. Hence, the integer part TRK_INT' controls which integer tracking capacitor(s) in the capacitor array 201 should be enabled, the integer part MOD_INT' controls which integer tracking capacitor(s) in the capacitor array 202 should be enabled, and the SDM output TRK_FRAC controls which fractional tracking capacitor(s) in the capacitor array 203 should be enabled.

To improve the TX modulation performance, the capacitor mismatch (i.e., random capacitance error) of the capacitors in the capacitor array 202 and the systematic mismatch between capacitors of the capacitor arrays 202 and capacitors of the capacitor array 203 should be properly compensated. Thus, the first step is to measure/characterize the capacitor mismatch and the systematic mismatch. In this embodiment, the measurement apparatus 114 includes a measuring circuit 222 and an estimating circuit 224. When the measurement apparatus 114 is enabled for measuring the mismatches in the DCO 108, the compensation apparatus 116 is disabled without applying any adjustment to the integer part and the fractional part of the filter output LF_OUT. That is, the integer part and the fractional part of the filter output LF_OUT are bypassed by the compensation apparatus 116 during the mismatch measurement procedure.

Figure 3:
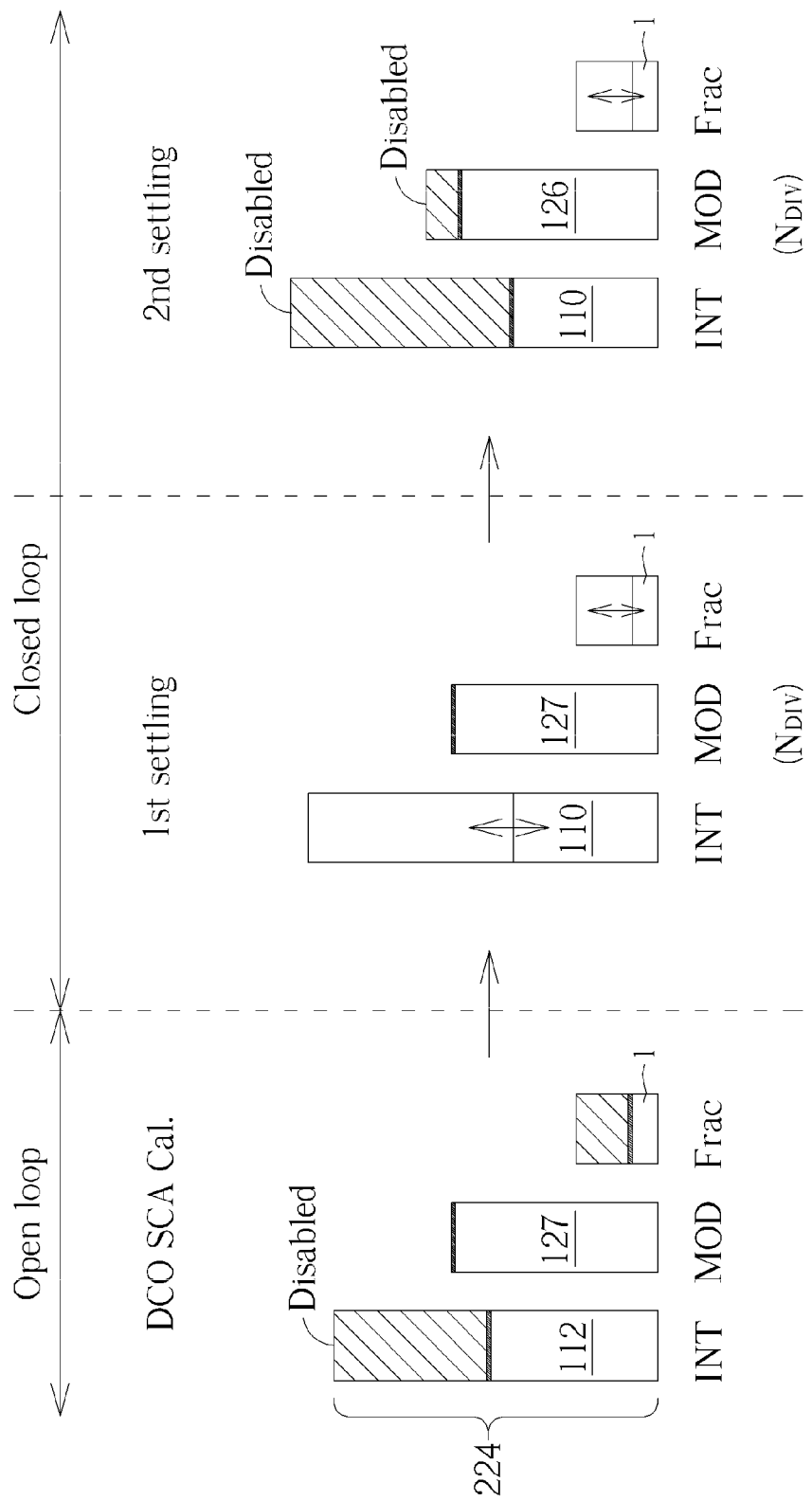
FIG. 3 is a diagram illustrating an example of the measurement operation according to the present invention.

Please refer to FIG. 3, which is a diagram illustrating an example of one measurement operation according to the present invention. The mismatch measurement for one capacitor in the capacitor array 202 includes three successive phases: a DCO SCA calibration phase, a first settling phase and a second settling phase. However, this is for illustrative purposes only, and is not meant to be a limitation of the present invention. That is, any measurement scheme using the fractional tracking capacitors to measure the capacitor mismatches of the integer tracking capacitors falls within the scope of the present invention. In the DCO SCA calibration phase, the measuring circuit 222 instructs the ADPLL 100 to make the DCO 108 operated in an open loop, and make all of the tracking capacitors in the capacitor arrays 201-203 fixed. As shown in FIG. 3, half of the capacitors in the capacitor arrays 201 are enabled, all of the capacitors in the capacitor array 202 are enabled, and one of the capacitors in the capacitor array 203 is enabled. Hence, the DCO frequency is brought closer to a target value by the SCA under the open loop control.

In the first settling phase following the DCO SCA calibration phase, the measuring circuit 222 instructs the ADPLL 100 to make the DCO 108 operated in a closed loop, and only make the capacitors in the capacitor array 202 fixed. As shown in FIG. 3, all of the capacitors in the capacitor array 202 are enabled. Hence, the capacitor arrays 201 and 203 are adjusted/settled to work out the SCA residual error. That is, the number of capacitors in the capacitor array 201 and the number of capacitors in the capacitor array 203 are adaptively adjusted in a closed loop to make the DCO frequency locked to the target value. As the SCA error is compensated in the first settling phase, the accuracy of the following mismatch measurement of the tracking capacitors is improved. In this embodiment, when the DCO frequency is locked to the target value, the number of enabled capacitors in the capacitor array 201 is equal to 110. At the end of the first settling phase, a first characteristic value derived from the digital control word (i.e., the filter output LF_OUT) adaptively adjusted in the first settling phase is recorded. As the capacitor array 203 is controlled by the SDM output TRK_FRAC, the number of enabled capacitors in the capacitor array 202 is continuously changed due to sigma-delta modulation. Thus, the filter output LF_OUT is not fixed during the first settling phase. By way of example, but not limitation, the first characteristic value may be an average of values of the filter output LF_OUT over a predetermined period of time (e.g., 30 us).

In the second settling phase following the first settling phase, the measuring circuit 222 instructs the ADPLL 100 to make the DCO 108 operated in the closed loop, and make the capacitors in the capacitor arrays 201 and 202 fixed. As shown in FIG. 3, the number of enabled capacitors in the capacitor array 201 is frozen at the end of the first settling phase, and one of capacitors in the capacitor array 202 is disabled. That is, regarding the capacitor array 202, a target capacitor to be measured is disabled in the second settling phase. As one integer capacitor in the capacitor array 202 is disabled, the number of fractional capacitors (i.e., capacitors in the capacitor array 203) would be increased under the closed loop control to make the DCO frequency locked to the target value. In other words, in the second settling phase, the capacitor array 203 is adjusted/settled to keep the DCO frequency locked. Similarly, at the end of the second settling phase, a second characteristic value derived from the digital control word (i.e., the filter output LF_OUT) adaptively adjusted in the second settling phase is recorded. As mentioned above, the capacitor array 203 is controlled by the SDM output TRK_FRAC. Hence, the number of enabled capacitors in the capacitor array 202 is continuously changed due to sigma-delta modulation. In other words, the filter output LF_OUT is not fixed during the second settling phase. By way of example, but not limitation, the second characteristic value may be an average of values of the filter output LF_OUT over a predetermined period of time (e.g., 30 us).

It should be noted that the frequency divisor $N_{DIV}$ used by the frequency divider 110 is not further adjusted by any additional pre-calculated amount during mismatch measurement for each capacitor in the capacitor array 202. After the first characteristic value and the second characteristic value are obtained, the measuring circuit 222 calculates a difference value between the first characteristic value and the second characteristic value, where the difference value indicates the capacitor mismatch (i.e., the $K_{DCO}$ mismatch) of the measured capacitor (i.e., the capacitor of the capacitor array 202 that is disabled in the second settling phase) in terms of the fractional capacitor unit size. The difference value may be derived from the following equations.

$$\text{unit\_mod} = \text{C\_lsb} * (1 + dC) \quad (1)$$

$$\text{unit\_frac} = \text{C\_lsb} * (1 + \text{kfrac\_err}) \quad (2)$$

$$\begin{aligned}\Delta\text{lf\_out} &= \text{lf\_out2} - \text{lf\_out1} \\ &= \left[\frac{\text{C\_lsb} \cdot (1 + dC)}{\text{C\_lsb} \cdot (1 + \text{kfrac\_err})} - 1\right] \\ &= \frac{dC - \text{kfrac\_err}}{1 + \text{kfrac\_err}} \\ &= \frac{dC}{1 + \text{kfrac\_err}} - \frac{\text{kfrac\_err}}{1 + \text{kfrac\_err}}\end{aligned} \quad (3)$$

In above equations, unit_mod represents the actual capacitance value of a capacitor in the capacitor array 202, unit_frac represents the actual capacitance value of a capacitor in the capacitor array 203, C_lsb represents an ideal capacitance value of a tracking capacitor, dC represents the capacitor mismatch, kfrac_err represents the systematic mismatch, lf_out1 represents the first characteristic value, lf_out2 represents the second characteristic value, and Δlf_out represents the difference value.

To put it simply, one measurement operation performed by the measuring circuit 222 includes at least the following steps: in a first settling phase, controlling a first capacitor array of the DCO to have a first capacitive value consistently, wherein a second capacitor array of the DCO is controlled in a closed loop to make a frequency of the DCO locked to a target value, the first capacitor array is responsive to an integer part of a digital control word, and the second capacitor array is responsive to a fractional part of the digital control word; in a second settling phase, controlling the first capacitor array to have a second capacitive value consistently, wherein the second capacitor array is controlled in the closed loop to make the frequency of the DCO locked to the target value, and the second capacitive value is different from the first capacitive value; and calculating a difference value between a first characteristic value and a second characteristic value, wherein the first characteristic value is derived from the digital control word adaptively adjusted in the first settling phase, and the second characteristic value is derived from the digital control word adaptively adjusted in the second settling phase.

Figure 4:
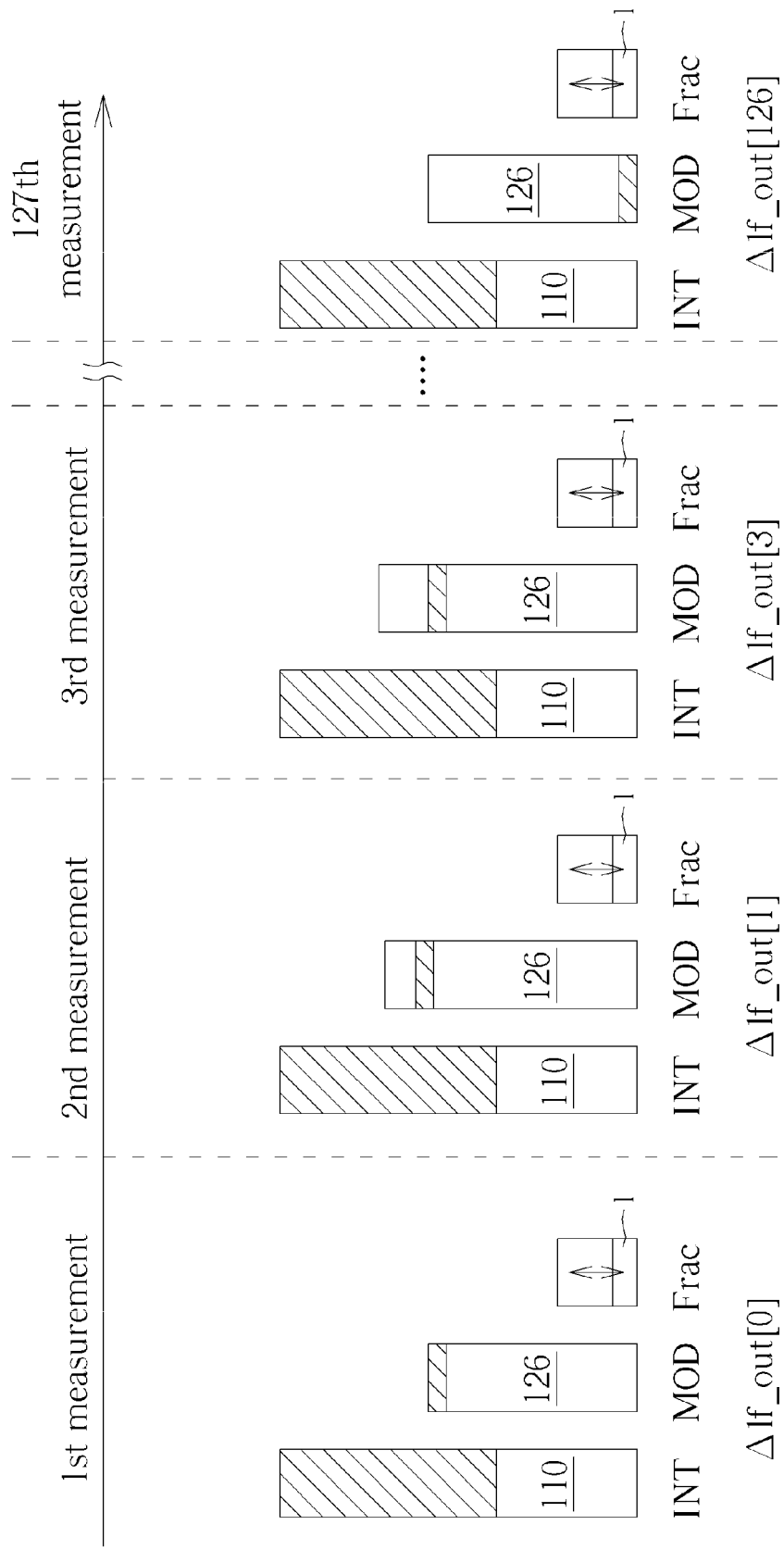
FIG. 4 is a diagram illustrating a plurality of measurement operations based on the mismatch measurement shown in FIG. 3.

The above-mentioned measurement operation is sequentially applied to all capacitors included in the capacitor array 202. Specifically, if the capacitor array 202 has N capacitors included therein, the measuring circuit 222 obtains N difference values by sequentially performing N aforementioned measurement operation. In this embodiment, N=127. Hence, 127 different values Δlf_out[0]-Δlf_out[126] are sequentially obtained, as shown in FIG. 4.

The estimating circuit 224 of the measurement apparatus 114 is arranged to estimate mismatches in the DCO 108 according to at least the difference value generated from the at least one measurement operation. In this embodiment, as the measuring circuit 222 generates a plurality of difference values Δlf_out[0:126], the estimating circuit 224 is operative to refer to the difference values Δlf_out[0:126] to measure the capacitor mismatch (i.e., a random capacitance error) of each capacitor in the capacitor array 202 and the systematic mismatch between capacitors of the capacitor array 202 and capacitors of the capacitor array 203. Specifically, the estimating circuit 224 calculates an average value x of the difference values Δlf_out[0:126], and then estimates a systematic mismatch kfrac_err_est according to the average value x. Besides, the estimating circuit further estimates a capacitor mismatch dC_est[k] of each capacitor in the capacitor array 202 according to a difference value Δlf_out[k] corresponding to the capacitor, the estimated systematic mismatch kfrac_err_est, and the average value x.

Figure 5:
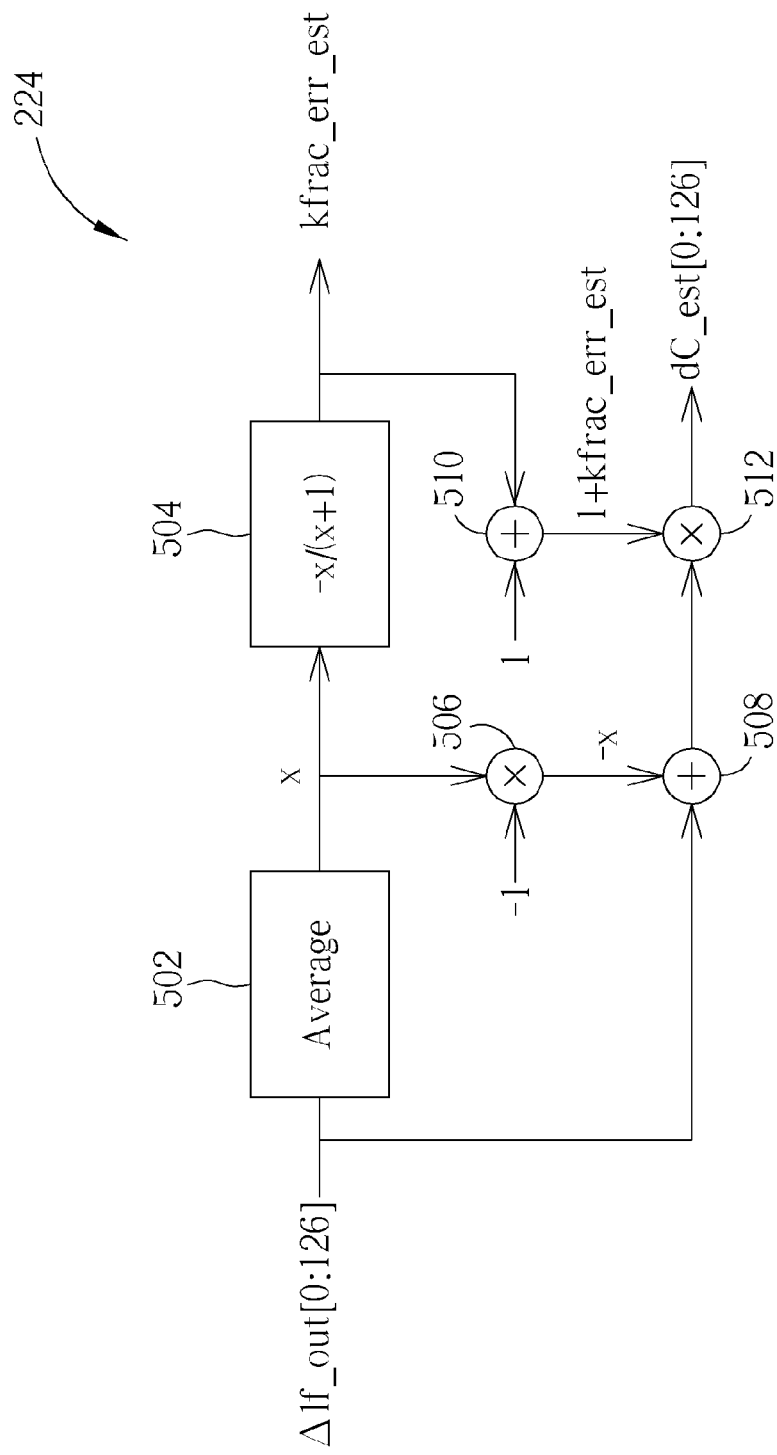
FIG. 5 is a diagram illustrating an exemplary implementation of the estimating circuit shown in FIG. 2.

Please refer to FIG. 5, which is a diagram illustrating an exemplary implementation of the estimating circuit 224 shown in FIG. 2. The estimating circuit 224 includes a plurality of processing units 502-512, where the processing unit 502 is for performing an average operation, the processing unit 504 is for performing a −X/(X+1) operation, each of the processing units 506 and 512 is a multiplier for performing a multiplication operation, and each of the processing units 508 and 510 is an adder for performing a summation operation. In accordance with above equation (3), a difference Δlf_out[k] of a corresponding capacitor indexed by k can be expressed as below.

$$\Delta \text{lf\_out}[k] = \frac{dC[k]}{1 + \text{kfrac\_err}} - \frac{\text{kfrac\_err}}{1 + \text{kfrac\_err}} \quad (4)$$

Hence, the calculation of the average value x may be expressed by the following equation.

$$x = \frac{\sum_{k=0}^{126} \Delta \text{lf\_out}[k]}{127} = \quad (5)$$

$$\frac{\sum_{k=0}^{126} dC[k]}{127 \cdot (1 + \text{kfrac\_err})} - \frac{\text{kfrac\_err}}{1 + \text{kfrac\_err}} \approx -\frac{\text{kfrac\_err}}{1 + \text{kfrac\_err}}$$

It should be noted that the capacitor mismatch dC[k] is a random capacitance error. Thus, the term $$\sum_{k=0}^{126} dC[k]$$

may be regarded as zero due to random distribution of the capacitor mismatches dC[0]-dC[126].

After the average value x is obtained, the following processing unit 504 is operative to estimate the systematic mismatch kfrac_err_est. The calculation of the systematic mismatch kfrac_err_est may be expressed by the following equation.

$$\frac{-x}{x+1} = \quad (6)$$

$$\frac{-\left(-\frac{\text{kfrac\_err}}{1+\text{kfrac\_err}}\right)}{\left(-\frac{\text{kfrac\_err}}{1+\text{kfrac\_err}}\right)+1} = \frac{\text{kfrac\_err}}{-\text{kfrac\_err}+(1+\text{kfrac\_err})} = \text{kfrac\_err}$$

The processing units 506, 508, 510 and 512 are used to obtain an estimated capacitor mismatch dC_est[k] for each capacitor in the capacitor array 202. The calculation of the capacitor mismatch dC_est[k] may be expressed by the following equation.

$$(\Delta \text{lf\_out}[k] - x) \cdot (1 + \text{kfrac\_err}) = \quad (7)$$

$$\frac{dC[k]}{1 + \text{kfrac\_err}} \cdot (1 + \text{kfrac\_err}) = dC[k]$$

After the estimated systematic mismatch kfrac_err_est and the estimated capacitor mismatches dC_est[0:126] are generated by the estimating circuit 224, the following compensation apparatus 116 can be enabled to start compensating the DCO 108 for estimated mismatches. Please refer to FIG. 2 again. In this embodiment, the compensation apparatus 116 includes a processing circuit 232, a compensating circuit 234, a checking circuit 236, and an adjusting circuit 238, wherein the adjusting circuit 238 includes a plurality of multiplexers 242, 244 and a plurality of adders 246, 248. The processing circuit 232 receives the estimated capacitor mismatches dC_est[0:126], and computes a look-up table LUT correspondingly. As the capacitor array 202 is a thermometer coded capacitor array, the look-up table LUT is therefore built by accumulating the estimated capacitor mismatches dC_est[0:126]. For example, the look-up table LUT is configured to have 128 table entries LUT[0]-LUT[127]. It should be noted that LUT[0]=0, and $$LUT[i] = \sum_{i=0}^{i-1} dC\_est[i],$$

where i>0. More specifically, LUT[1]=dC_est[0], LUT[2]=dC_est[0]+dC_est[1], and $$LUT[127] = \sum_{i=0}^{126} dC\_est[i].$$

For example, an exemplary look-up table LUT built in the processing circuit 232 is as below.

| Look-up Table | |
|---|---|
| Table index (i) | Capacitor Mismatch (%) |
| 0 | 0 |
| 1 | 9 |
| 2 | 4 |
| 3 | 3 |
| ... | ... |
| 64 | −2 |
| 65 | 5 |
| 66 | −7 |
| ... | ... |
| 125 | 6 |
| 126 | 5 |
| 127 | −1 |

The processing circuit 232 determines a first compensation value C1 according to the integer part $INT_2$, and supplies the first compensation value C1 to the compensation circuit 234 for capacitor mismatch compensation. Besides, the processing circuit 232 further supplies a second compensation value C2 to the compensation circuit 234 for systematic mismatch compensation.

Regarding the compensating circuit 234, it is arranged for adjusting the fractional part FRAC according to the first compensation value C1 and the second compensation value C2 such that an accumulated capacitor mismatch of selected capacitors in the capacitor array 202 that are enabled according to the integer part $INT_2$ is compensated due to the first compensation value C1, and a systematic mismatch between capacitors in the capacitor array 202 and capacitors in the capacitor array 203 is compensated due to the second compensation value C2. Please refer to FIG. 6, which is a diagram illustrating a first exemplary implementation of the compensating circuit 234 shown in FIG. 2. The compensating circuit 234 shown in FIG. 6 has an adder 602 for performing a subtraction operation and a multiplier 604 for performing a multiplication operation. Supposing that the aforementioned look-up table LUT is built in the processing circuit 232, the processing circuit 232 refers to the integer part $INT_2$ to search the pre-computed look-up table LUT[0:127] for the first compensation value C1, and sets the second compensation value C2 by (1−kfrac_err_est). As can be seen from above equation (2), the system mismatch term (1+kfrac_err) should be removed to make the capacitor mismatch of the capacitors in the capacitor array 202 correctly compensated by using capacitor(s) in the capacitor array 203. As $$\frac{1}{1+\text{kfrac\_err}} \cong 1 - \text{kfrac\_err},$$

the second compensation value C2 is therefore set by (1−kfrac_err_est) to simplify the compensation operation.

As mentioned above, one integer capacitor in the capacitor array 202 is disabled, and then the capacitor mismatch of the disabled integer capacitor is estimated using the fractional capacitor(s) in the capacitor array 203. A compensation amount ΔFrac to be applied to the fractional part FRAC is determined according to estimated capacitor mismatches dC_est[0:126]. In this embodiment, C1=ΔFrac=LUT[INT$_2$]. As the capacitor mismatch of one integer capacitor is estimated in terms of the fractional capacitor unit size, an estimated capacitor mismatch dC_est may be a large positive value. Hence, a subtraction output generated from the adder 602, which subtracts the compensation amount ΔFrac from the original fractional part FRAC, may be a negative value not acceptable to the following sigma-delta modulator 216. The present invention further proposes a protection mechanism implemented using the checking circuit 236 and the adjusting circuit 238.

The checking circuit 236 is arranged for checking if a predetermined criterion is satisfied. For example, the checking circuit 236 determines that the predetermined criterion is satisfied when the fractional part FRAC becomes negative when compensated by the compensation amount ΔFrac (i.e., LUT[INT$_2$]) corresponding to the original integer part INT$_2$. If the predetermined criterion is satisfied, this means that the fractional part FRAC should be adjusted before processed by the adder 602; otherwise, the subtraction output of the adder 602 would be a negative value. However, if the predetermined criterion is not satisfied, this means that the fractional part FRAC needs no adjustment before processed by the adder 602 due to the fact that the subtraction output of the adder 602 would not be a negative value.

The adjusting circuit 238 is arranged for selectively adjusting the incoming fractional part FRAC according to a checking result generated by the checking circuit 236. In a case where the checking circuit 236 determines that the predetermined criterion is not satisfied, the checking circuit 236 sets the selection signal SEL by a logic low level (i.e., SEL=0). Hence, the multiplexer 242 outputs a digital value 0 to the adder 246, and the multiplexer 244 outputs a digital value 0 to the adder 248. As neither the integer part INT$_2$ nor the fractional part FRAC is affected by the digital value 0, the summation output of the adder 246 is INT$_2$, and the summation output of the adder 248 is FRAC. Thus, the subtraction output of the adder 602 is FRAC−ΔFrac.

However, in another case where checking circuit 236 determines that the predetermined criterion is satisfied, the checking circuit 236 sets the selection signal SEL by a logic high level (i.e., SEL=1). Hence, the multiplexer 242 outputs a digital value −1 to the adder 246, and the multiplexer 244 outputs a digital value +1 to the adder 248. Consequently, the summation output of the adder 246 is INT$_2$−1, and the summation output of the adder 248 is FRAC+1. Thus, the subtraction output of the adder 602 is FRAC+1−ΔFrac. As the integer part is decreased to be INT$_2$−1 (i.e., INT$_2$=INT$_2$−1), the processing circuit 232 determines the first compensation value C1 according to the decreased integer part (e.g., C1=LUT[INT$_2$−1]). To put it simply, the adjusting circuit 238 is arranged for increasing the fractional part by an adjustment value and decreasing the integer part by the adjustment value when the predetermined criterion is satisfied, wherein the processing circuit 232 determines the first compensation value according to the decreased integer part, and the compensating circuit 234 is arranged to adjust the increased fractional part according to the first compensation value and the second compensation value provided by the processing circuit 232.

The above-mentioned operation can be expressed using the following pseudo code.

```
Δ Frac=LUT[INT₂]
If ((FRAC−Δ Frac)>=0)
    FRAC=FRAC−Δ Frac
else
    INT₂=INT₂−1
    Δ Frac=LUT[INT₂]
    FRAC=FRAC+1−Δ Frac
```

For better understanding of the above-mentioned operation, an example is given here. Suppose that the aforementioned look-up table LUT[0:127] is employed, FRAC=0.02, and INT$_2$=65.

ΔFrac=LUT[65]=0.05

(FRAC−ΔFrac)=0.02−0.05=−0.03<0

INT$_2$=65−1=64

ΔFrac=LUT[64]=0.02

FRAC=0.02+1−(−0.02)=1.04

Figure 6:
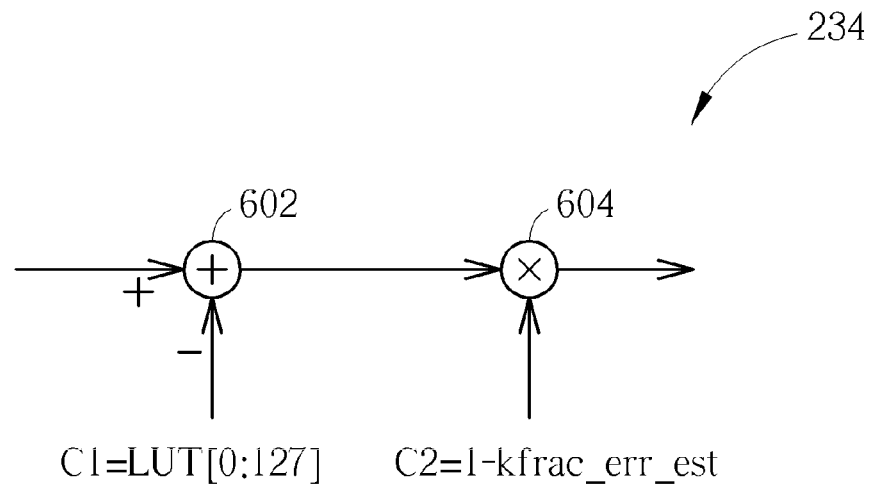
FIG. 6 is a diagram illustrating a first exemplary implementation of the compensating circuit shown in FIG. 2.
Figure 7:
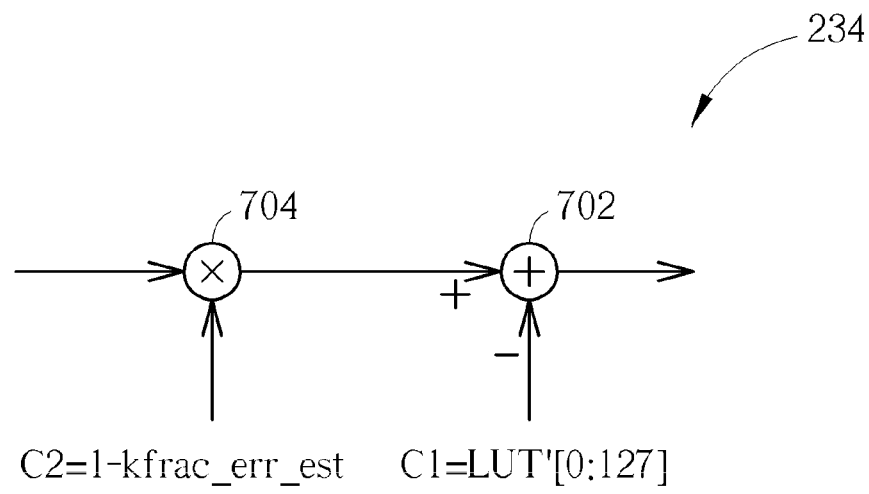
FIG. 7 is a diagram illustrating a second exemplary implementation of the compensating circuit shown in FIG. 2.

The circuit configuration shown in FIG. 6 is for illustrative purposes only, and is not meant to be a limitation of the present invention. Please refer to FIG. 7, which is a diagram illustrating a second exemplary implementation of the compensating circuit 234 shown in FIG. 2. The compensating circuit 234 shown in FIG. 7 has an adder 702 for performing a subtraction operation and a multiplier 704 for performing a multiplication operation. The major difference between the exemplary circuits shown in FIG. 6 and FIG. 7 is the order of the subtraction operation and the multiplication operation. When the compensating circuit 234 shown in FIG. 2 is implemented using the circuit shown in FIG. 7, the aforementioned look-up table LUT should be adequately modified to have table entries LUT'[0]−LUT'[127]. The processing circuit 232 refers to the integer part INT$_2$ to search the pre-computed look-up table LUT'[0:127] for the first compensation value C1, and sets the second compensation value C2 by 1+kfrac_err_est. The same objective of compensating the DCO 108 for estimated mismatches is achieved.

Figure 8:
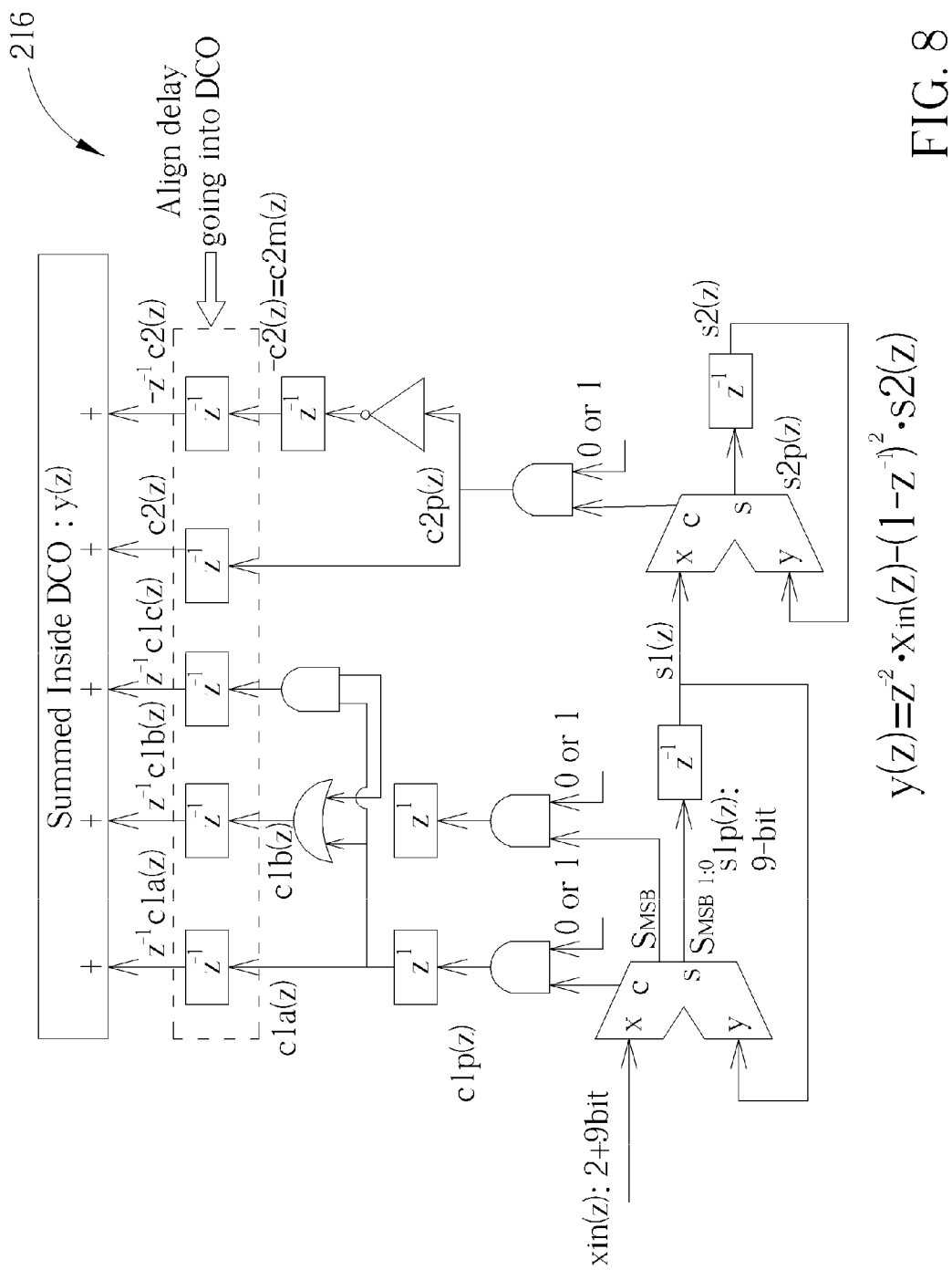
FIG. 8 is a diagram illustrating an exemplary implementation of the sigma-delta modulator shown in FIG. 2 according to the present invention.

Regarding the conventional sigma-delta modulator design, the input range is limited to [0 1]. However, as the present invention proposes measuring the capacitor mismatch of an integer capacitor by using fractional capacitors, the SDM input may be greater than one. Thus, the conventional sigma-delta modulator design is not suitable for realizing the sigma-delta modulator 216 shown in FIG. 2. The present invention therefore proposes an innovative sigma-delta modulator design with an enhanced input range. Please refer to FIG. 8, which is a diagram illustrating an exemplary implementation of the sigma-delta modulator 216 shown in FIG. 2 according to the present invention. As shown in FIG. 8, the sigma-delta modulator 216 is a $2^{nd}$ order sigma-delta modulator with an input range [0 3.999] larger than an input range [0 1] of the conventional sigma-delta modulator. Besides, in response to an SDM input xin(z), the sigma-delta modulator 216 shown in FIG. 8 generates an SDM output y(z) with five bits $z^{-1}*c1a$ (z), $z^{-1}*c1b(z)$, $z^{-1}*c1c(z)$, c2(z) and $-z^{-1}*c2(z)$ for controlling five fractional tracking capacitors.

Figure 9:
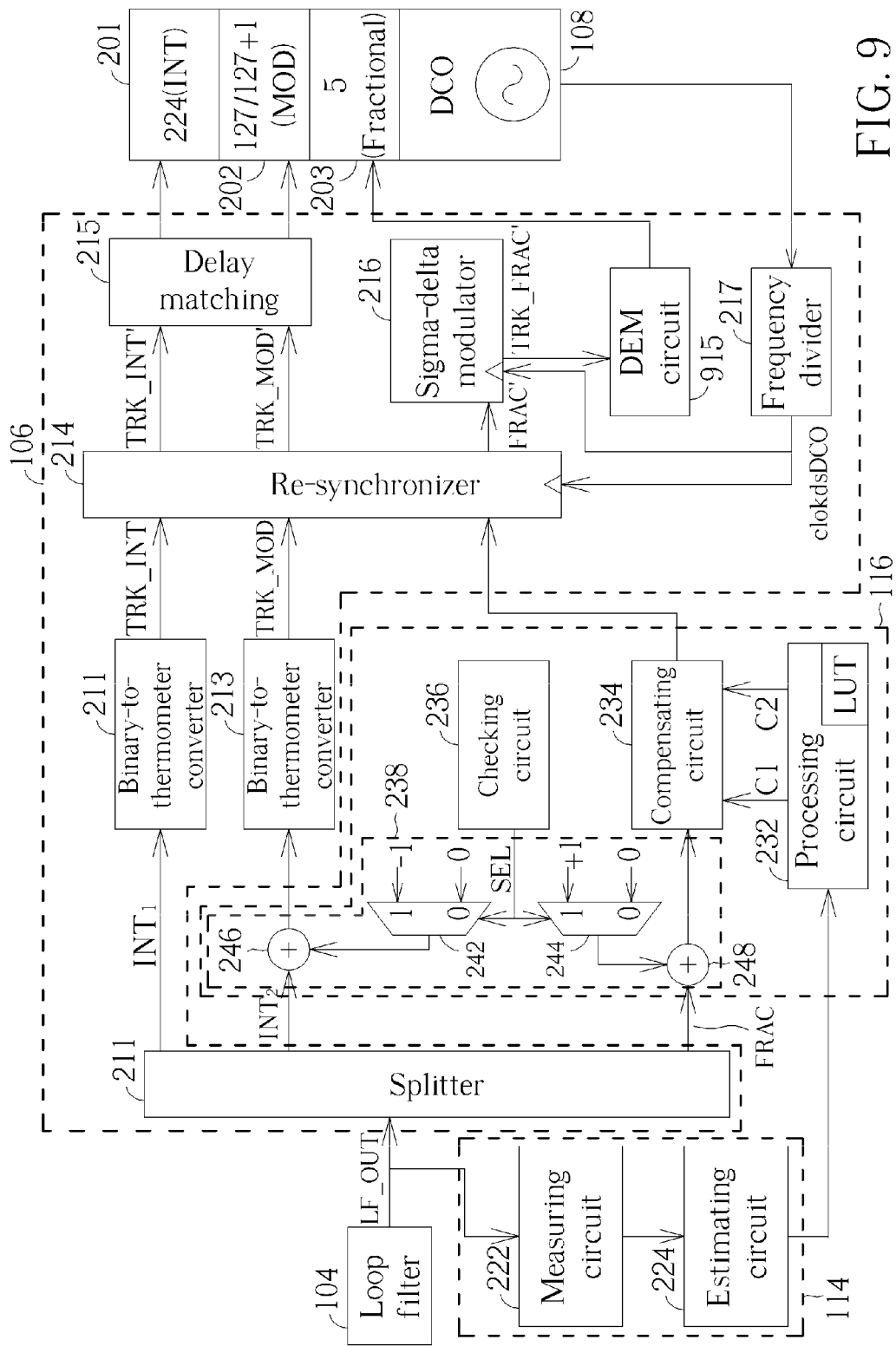
FIG. 9 is a diagram illustrating another exemplary implementation of part of the ADPLL shown in FIG. 1.

As the capacitor mismatch of an integer capacitor (i.e., one capacitor of the capacitor array 202) is measured by using fractional capacitors (i.e., capacitors of the capacitor array 203), all the fractional capacitors are assumed to have the same capacitance value. Actually, the capacitors of the capacitor array 203 may not have the same capacitance value, thus degrading the mismatch measurement performance. As a result, the estimated capacitor mismatches dC_est[0:126] may be deviated from the actual capacitor mismatches due to the mismatched capacitors in the capacitor array 203. To overcome the mismatch induced estimation accuracy loss, a dynamic element matching (DEM) technique is used. Please refer to FIG. 9, which is a diagram illustrating another exemplary implementation of part of the ADPLL 100 shown in FIG. 1. The major difference between the exemplary circuits shown in FIG. 2 and FIG. 9 is a DEM circuit 915 coupled between the sigma-delta modulator 216 and the capacitor array 203. The DEM circuit 915 is arranged for transmitting the SDM output TRK_FRAC to the capacitor array 203 of the DCO 108. With the help of the DEM circuit 915, different capacitors in the capacitor array 203 may be selected and enabled when two SDM outputs having the same digital value are generated from the sigma-delta modulator 216.

Figure 10:
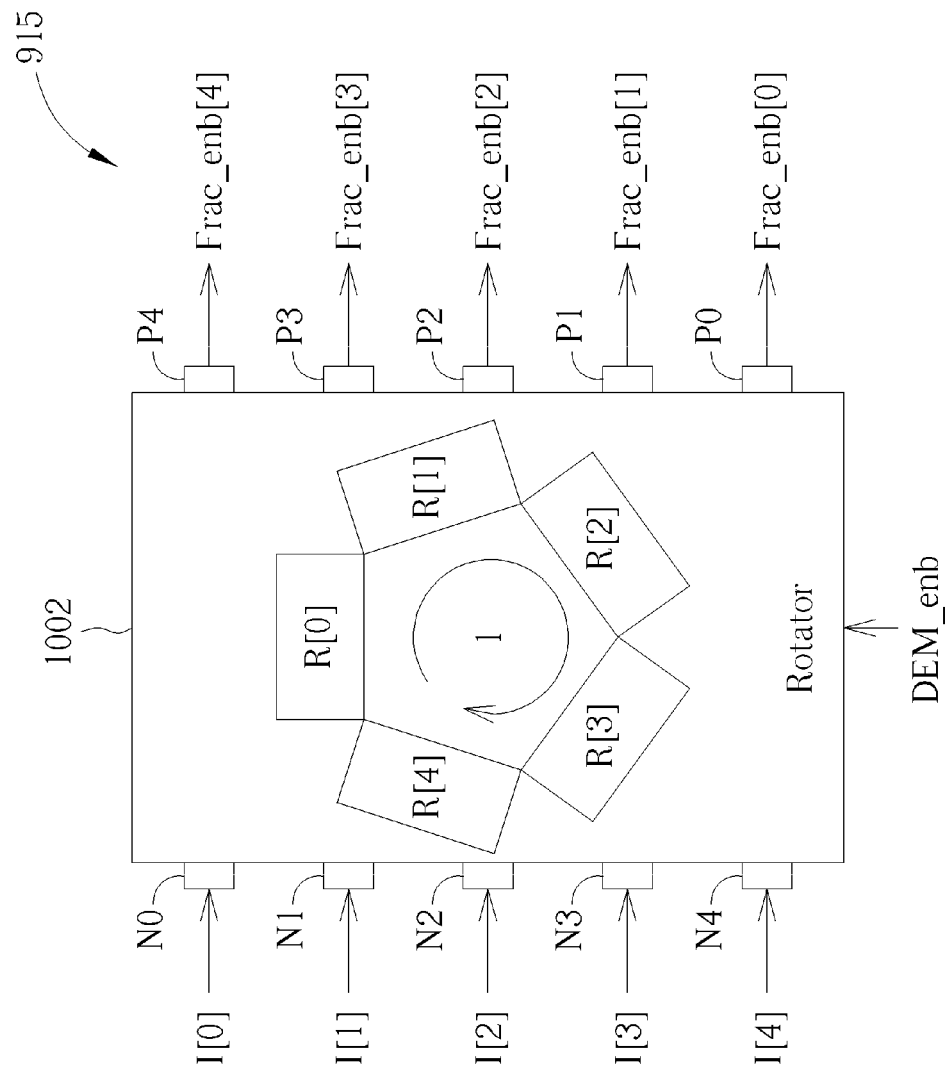
FIG. 10 is a diagram illustrating an exemplary implementation of the DEM circuit shown in FIG. 9.

Please refer to FIG. 10, which is a diagram illustrating an exemplary implementation of the DEM circuit 915 shown in FIG. 9. In this embodiment, the DEM circuit 915 is implemented by a rotator 1002 supporting a plurality of different connection arrangements R[0]-R[4], wherein each of the connection arrangements R[0]-R[4] is used to connect the input nodes N0-N4 to the output nodes P0-P4. Supposing that the sigma-delta modulator 216 is implemented using the sigma-delta modulator design shown in FIG. 8, the SDM output TRK_FRAC would include five bits I[0], I[1], I[2], I[3] and I[4] (i.e., $z^{-1}*c1a(z)$, $z^{-1}*c1b(z)$, $z^{-1}*c1c(z)$, c2(z) and $-z^{-1}*c2(z)$) to enable/disable five capacitors included in the capacitor array 203, respectively, where the capacitors of the capacitor array 203 are enabled/disabled by 5 bits Frac_enb[0], Frac_enb[1], Frac_enb[2], Frac_enb[3] and Frac_enb[4], and each of the bits I[0]-I[4] is assigned to one of the bits Frac_enb[0]-Frac_enb[4] through a connection arrangement employed by the rotator 1002. The rotator 1002 acts as a connection switch. For example, when a control signal DEM_enb has a logic high level (i.e., DEM_enb=1), the connection arrangements R[0]-R[4] are cyclically selected by the rotator 1002; and when the control signal DEM_enb has a logic low level (i.e., DEM_enb=0), one of the connection arrangements R[0]-R[4] is selected and consistently used by the rotator 1002. The operation of the rotator 1002 may be expressed by following pseudo code.

```
If (DEM_enb==0)
    R=1
else
    R=R<<1
```

By way of example, when the connection arrangement R[0] is selected, the bits Frac_enb[0]-Frac_enb[4] are set by I[0]-I[4], respectively; when the connection arrangement R[1] is selected, the bits Frac_enb[0]-Frac_enb[4] are set by I[1]-I[4] and I[0], respectively; when the connection arrangement R[2] is selected, the bits Frac_enb[0]-Frac_enb[4] are set by I[2]-I[4], I[0] and I[1], respectively; when the connection arrangement R[3] is selected, the bits Frac_enb[0]-Frac_enb[4] are set by I[3]-I[4] and I[0]-I[2], respectively; and when the connection arrangement R[4] is selected, the bits Frac_enb[0]-Frac_enb[4] are set by I[4] and I[0]-I[3], respectively. In short, the setting of the bits Frac_enb[0]-Frac_enb[4] may be expressed by following equations.

$$\text{Frac\_enb}[0]=(R[0]\&I[0])|(R[1]\&I[1])|(R[2]\&I[2])| \\ (R[3]\&I[3])|(R[4]\&I[4]) \qquad (8)$$

$$\text{Frac\_enb}[1]=(R[0]\&I[1])|(R[1]\&I[2])|(R[2]\&I[3])| \\ (R[3]\&I[4])|(R[4]\&I[0]) \qquad (9)$$

$$\text{Frac\_enb}[2]=(R[0]\&I[2])|(R[1]\&I[3])|(R[2]\&I[4])| \\ (R[3]\&I[0])|(R[4]\&I[1]) \qquad (10)$$

$$\text{Frac\_enb}[3]=(R[0]\&I[3])|(R[1]\&I[4])|(R[2]\&I[0])|(R \\ [3]\&I[1])|(R[4]\&I[2]) \qquad (11)$$

$$\text{Frac\_enb}[4]=(R[0]\&I[4])|(R[1]\&I[0])|(R[2]\&I[1])|(R \\ [3]\&I[2])|(R[4]\&I[3]) \qquad (12)$$

In above exemplary embodiments, the capacitor array 202 is a thermometer coded capacitor array. However, the same concept may be applied to a binary coded capacitor array. In a case where the capacitor array 202 is a binary coded capacitor array, the capacitor array 202 is allowed to have fewer capacitors (e.g., 7 capacitors), and thus occupies a smaller chip/circuit area. Besides, the time required for mismatch measurement and compensation is significantly reduced. Moreover, the binary-to-thermometer converter 213 in FIG. 2/FIG. 9 is omitted, and the operations performed in the first settling phase and the second settling phase should be properly modified. Please refer to FIG. 11, which is a diagram illustrating an exemplary design of measurement operations performed by the measuring circuit 222 when the capacitor array 202 is a binary coded capacitor array. For clarity and simplicity, it is assumed that the capacitor array 202 has four capacitors $C_0$, $C_1$, $C_2$, $C_3$, where capacitance values of the capacitors $C_0$, $C_1$, $C_2$, $C_3$ have the following relationship: $C_3=8\times C_0$, $C_2=4\times C_0$, and $C_2=2\times C_0$.

In this embodiment, the measuring circuit 222 performs a plurality of measurement operations for different combinations of selected capacitors of the capacitor array 202 in the first settling phase and selected capacitors of the capacitor array 202 in the second settling phase, respectively. Regarding the first measurement operation performed by the measuring circuit 222, all of the capacitors $C_0$-$C_3$ are enabled in the first settling phase, and only the capacitor $C_0$ is disabled in the second settling phase. The difference between a first characteristic value (derived from the filter output LF_OUT at the end of the first settling phase) and a second characteristic value (derived from the filter output LF_OUT at the end of the second settling phase) is recorded as Δlf_out[0]. Regarding the second measurement operation performed by the measuring circuit 222, only the capacitor $C_0$ is disabled in the first settling phase, and only the capacitor $C_1$ is disabled in the second settling phase. The difference between a first characteristic value (derived from the filter output LF_OUT at the end of the first settling phase) and a second characteristic value (derived from the filter output LF_OUT at the end of the second settling phase) is recorded as Δlf_out[1]. Regarding the third measurement operation performed by the measuring circuit 222, the capacitors $C_0$-$C_1$ are disabled in the first settling phase, and only the capacitor $C_2$ is disabled in the second settling phase. The difference between a first characteristic value (derived from the filter output LF_OUT at the end of the first settling phase) and a second characteristic value (derived from the filter output LF_OUT at the end of the second setting phase) is recorded as Δlf_out[2]. Regarding the fourth measurement operation performed by the measuring circuit 222, only the capacitor $C_3$ is enabled in the first settling phase, and only the capacitor $C_3$ is disabled in the second settling phase. The difference between a first characteristic value (derived from the filter output LF_OUT at the end of the first setting phase) and a second characteristic value (derived from the filter output LF_OUT at the end of the second setting phase) is recorded as Δlf_out[3].

To put it simply, the measuring circuit 222 is arranged to consistently enable first selected capacitors in the capacitor array 202 in the first settling phase, and consistently enable second selected capacitors in the capacitor array 202 in the second settling phase, where a difference between an accumulated capacitive value of the first selected capacitors and an accumulated capacitive value of the second selected capacitors corresponds to a capacitive value of a smallest capacitor in the capacitor array 202.

Similarly, the estimating circuit 224 estimates the mismatches (e.g., the capacitor mismatch and systematic mismatch) according to the difference values Δlf_out[0]-Δlf_out[3]. Besides, the compensation apparatus 116 compensates the DCO 108 for the mismatches estimated by the measurement apparatus 114. The same object of providing a nearly perfect matched DCO without noisy penalty is achieved.

It is possible that the working temperature of the ADPLL may increase/decrease continuously when the measurement operations are sequentially performed. Hence, there may be an accumulated error caused by the temperature drift. Suppose that there is no systematic mismatch (i.e., kfrac_err=0), and there is a fixed error $\Delta_T$ due to temperature drift in each measurement operation. The difference values Δlf_out[0]-Δlf_out[3] obtained under such a background temperature drift condition may be expressed by following equations.

$$\Delta lf\_out[0]=dC_{act,1}+\Delta_T \quad (13)$$

$$\Delta lf\_out[1]=dC_{act,2}-dC_{act,1}+\Delta_T \quad (14)$$

$$\Delta lf\_out[2]=dC_{act,4}-dC_{act,1}-dC_{act,2}+\Delta_T \quad (15)$$

$$\Delta lf\_out[3]=dC_{act,8}-dC_{act,1}-dC_{act,2}-dC_{act,4}+\Delta_T \quad (16)$$

In above equations (13)-(16), $dC_{act}$ represents the actual capacitor mismatch. Based on above equations (13)-(16), estimated capacitor mismatches $dC_{est,1}$-$dC_{est,4}$ of the capacitors $C_0$-$C_3$ may be expressed as below.

$$dC_{est,1}=\Delta lf\_out[0]=dC_{act,1}+\Delta_T \quad (17)$$

$$dC_{est,2}=\Delta lf\_out[1]+dC_{est,1}=dC_{act,2}+2\cdot\Delta_T \quad (18)$$

$$dC_{est,4}=\Delta lf\_out[2]+dC_{est,1}+dC_{est,2}=dC_{act,4}+4\cdot\Delta_T \quad (19)$$

$$dC_{est,8}=\Delta lf\_out[3]+dC_{est,1}+dC_{est,2}+dC_{est,4}=dC_{act,8}+8\cdot\Delta_T \quad (20)$$

As can be seen from above equations (18)-(20), the error originated from the temperature drift is accumulated, which may affect the accuracy of the estimated capacitor mismatches.

Figure 11:
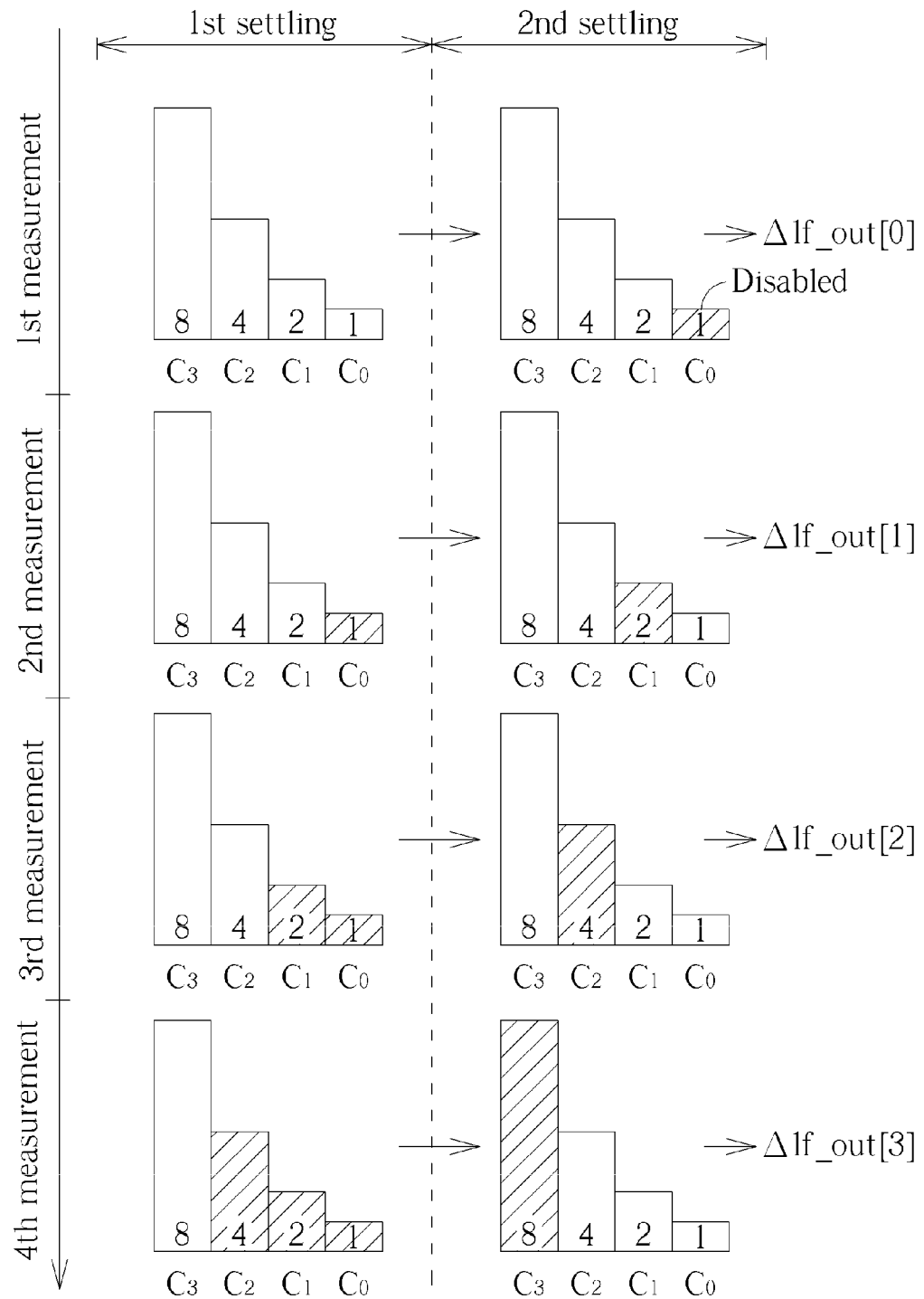
FIG. 11 is a diagram illustrating an exemplary design of measurement operations performed by the measuring circuit when the capacitor array is a binary coded capacitor array.
Figure 12:
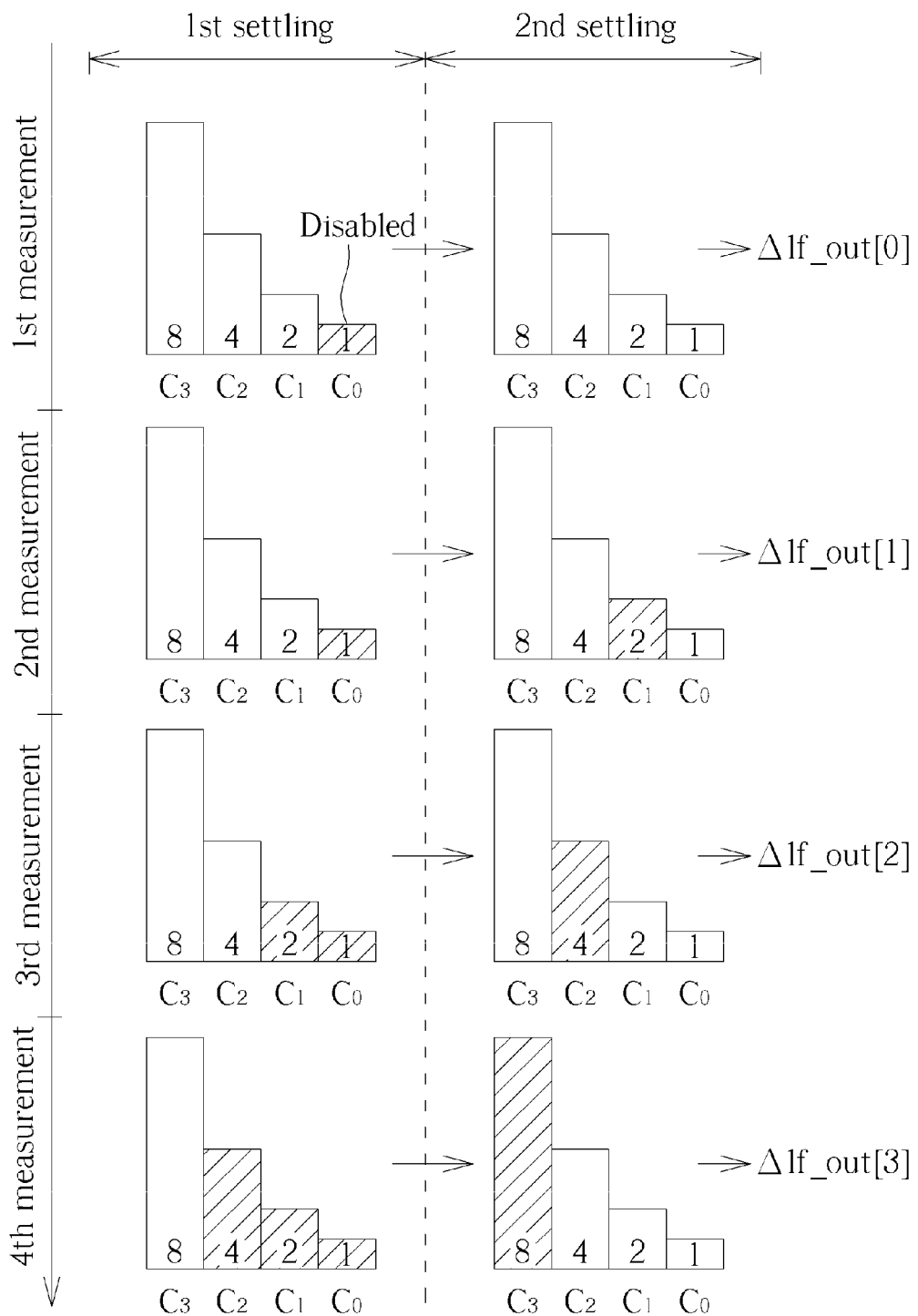
FIG. 12 is a diagram illustrating another exemplary design of measurement operations performed by the measuring circuit when the capacitor array is a binary coded capacitor array.

To deal with the background temperature drift, the present invention therefore proposes reversing the capacitor removal sequence in at least one measurement operation. Please refer to FIG. 12, which is a diagram illustrating another exemplary design of measurement operations performed by the measuring circuit 222 when the capacitor array 202 is a binary coded capacitor array. The major difference between the measurement examples shown in FIG. 11 and FIG. 12 is that the capacitor removal sequence in the first measurement operation is reversed. That is, regarding the first measurement operation performed by the measuring circuit 222, only the capacitor $C_0$ is disabled in the first settling phase, and all of the capacitors $C_0$-$C_3$ are enabled in the second settling phase. To put it simply, the measurement operations would include at least one measurement operation having an accumulated capacitive value of first selected capacitors in the first settling phase greater than an accumulated capacitive value of second selected capacitors in the second settling phase, and at least one measurement operation having an accumulated capacitive value of first selected capacitors in the first settling phase smaller than an accumulated capacitive value of second selected capacitors in the second settling phase. The difference values Δlf_out[0]-Δlf_out[3] may be expressed by following equations.

$$\Delta lf\_out[0]=-dC_{act,1}+\Delta_T \quad (21)$$

$$\Delta lf\_out[1]=dC_{act,2}-dC_{act,1}+\Delta_T \quad (22)$$

$$\Delta lf\_out[2]=dC_{act,4}-dC_{act,1}-dC_{act,2}+\Delta_T \quad (23)$$

$$\Delta lf\_out[3]=dC_{act,8}-dC_{act,1}-dC_{act,2}-dC_{act,4}+\Delta_T \quad (24)$$

Based on above equations (21)-(24), estimated capacitor mismatches $dC_{est,1}$-$dC_{est,4}$ of the capacitors $C_0$-$C_3$ may be expressed as below.

$$dC_{est,1}=-\Delta lf\_out[0]=dC_{act,1}-\Delta_T \quad (25)$$

$$dC_{est,2}=\Delta lf\_out[1]+dC_{est,1}=dC_{act,2} \quad (26)$$

$$dC_{est,4}=\Delta lf\_out[2]+dC_{est,1}+dC_{est,2}=dC_{act,2} \quad (27)$$

$$dC_{est,8}=\Delta lf\_out[3]+dC_{est,1}+dC_{est,2}+dC_{est,4}=dC_{act,2} \quad (28)$$

As can be seen from above equations (26)-(28), the error originated from the temperature drift is cancelled. In this way, the accuracy of the estimated capacitor mismatch is improved.

Figure 13:
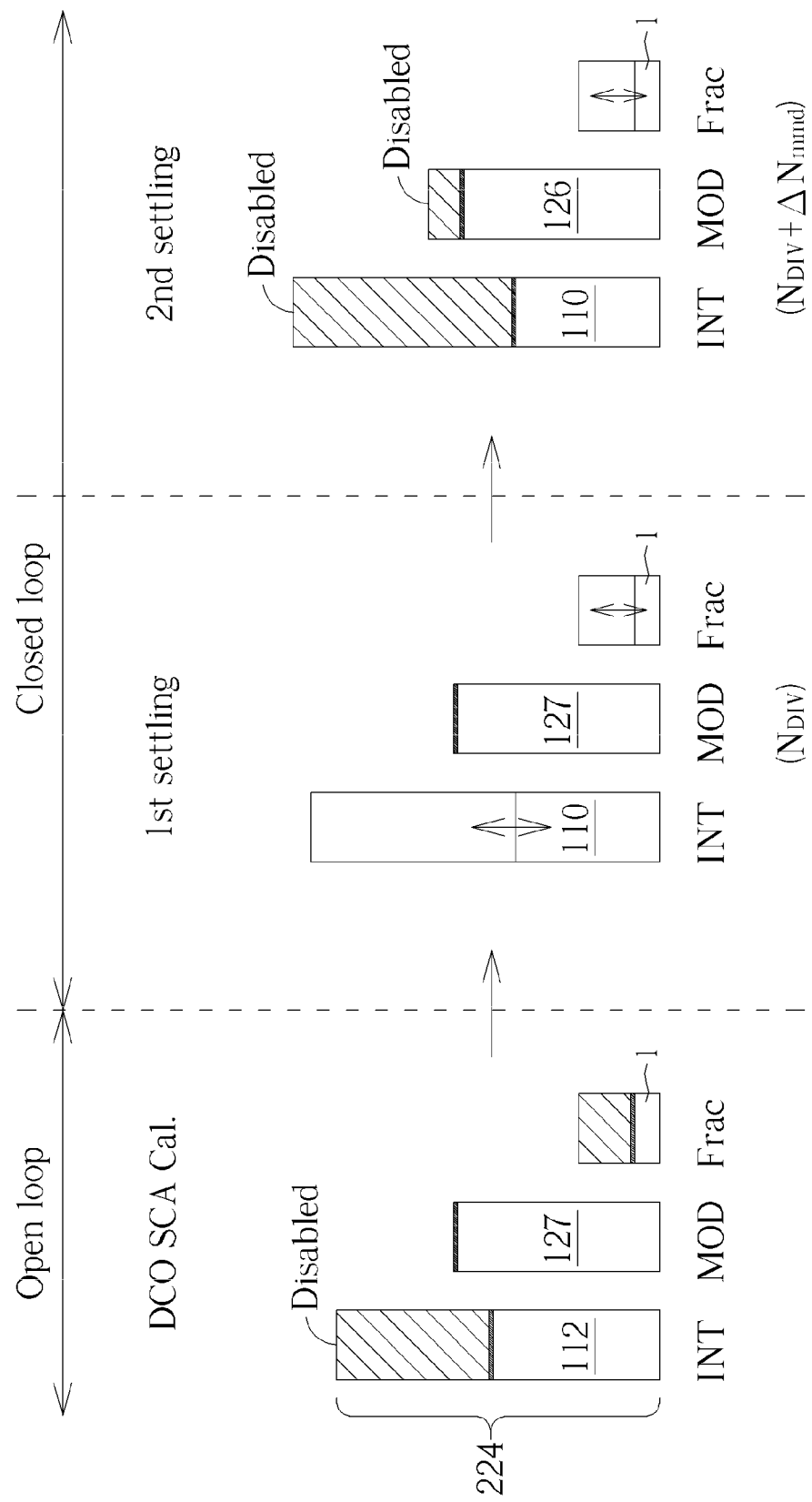
FIG. 13 is a diagram illustrating another example of the measurement operation according to the present invention.
Figure 14:
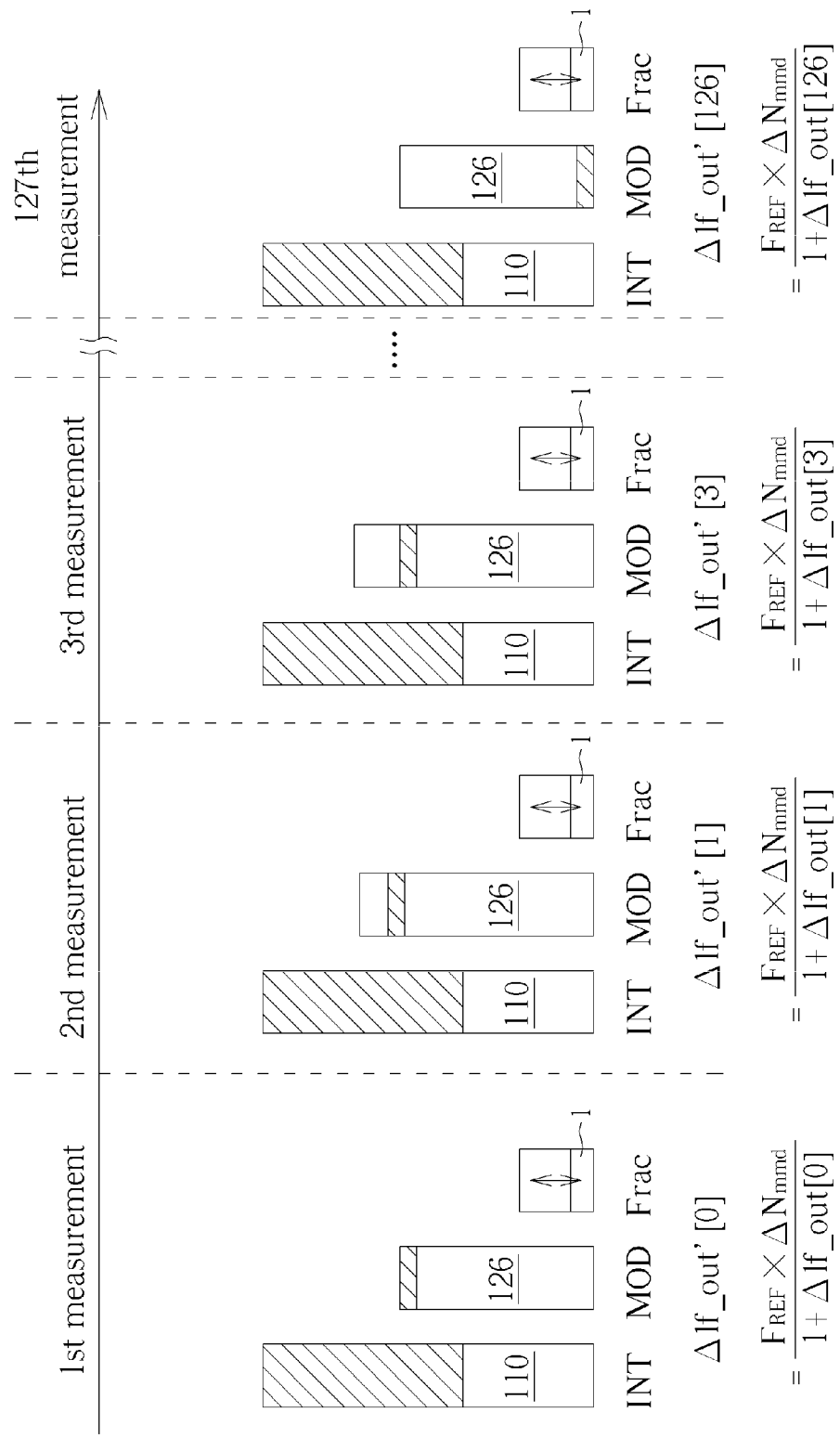
FIG. 14 is a diagram illustrating a plurality of measurement operations based on the mismatch measurement shown in FIG. 13.

In above embodiments, the frequency divisor $N_{DIV}$ is not adjusted by any additional pre-calculated amount during mismatch measurement for each capacitor in the capacitor array 202. Thus, the difference value Δlf_out obtained by equation (3) can indicate the capacitor mismatch (i.e., the $K_{DCO}$ mismatch) of the measured capacitor (i.e., the capacitor of the capacitor array 202 that is disabled in the second settling phase) in terms of the fractional capacitor unit size. However, this is for illustrative purposes only, and is not meant to be a limitation of the present invention. In practice, any measurement scheme using the fractional tracking capacitors to measure the capacitor mismatches of the integer tracking capacitors falls within the scope of the present invention. For example, in an alternative mismatch measurement design, the frequency divisor $N_{DIV}$ may be changed by an additional pre-calculated amount during mismatch measurement. Further details are described as below with reference to FIG. 13 and FIG. 14. FIG. 13 is a diagram illustrating another example of the measurement operation according to the present invention. FIG. 14 is a diagram illustrating a plurality of measurement operations based on the mismatch measurement shown in FIG. 13.

In the DCO SCA calibration phase, the measuring circuit 222 instructs the ADPLL 100 to make the DCO 108 operated in an open loop and make all of the tracking capacitors in the capacitor arrays 201-203 fixed. As shown in FIG. 13, half of the capacitors in the capacitor arrays 201 are enabled, all of the capacitors in the capacitor array 202 are enabled, and one of the capacitors in the capacitor array 203 is enabled. Hence, the DCO frequency is brought closer to a target value by the SCA under the open loop control.

In the first settling phase following the DCO SCA calibration phase, the measuring circuit 222 instructs the ADPLL 100 to make the DCO 108 operated in a closed loop, make the frequency divider 110 operated under a frequency divisor $N_{DIV}$, and only make the capacitors in the capacitor array 202 fixed. As shown in FIG. 13, all of the capacitors in the capacitor array 202 are enabled. Hence, the capacitor arrays 201 and 203 are adjusted/settled to work out the SCA residual error. That is, the number of capacitors in the capacitor array 201 and the number of capacitors in the capacitor array 203 are adaptively adjusted in a closed loop to make the DCO frequency locked to the target value, where the frequency divider 110 located at the feedback path is operated according to the frequency divisor $N_{DIV}$. At the end of the first settling phase, a first characteristic value derived from the digital control word (i.e., the filter output LF_OUT) adaptively adjusted in the first settling phase is recorded. As mentioned above, the capacitor array 203 is controlled by the SDM output TRK_FRAC, and the number of enabled capacitors in the capacitor array 202 is continuously changed due to sigma-delta modulation. As the filter output LF_OUT is not fixed during the first settling phase, the first characteristic value may be an average of values of the filter output LF_OUT over a predetermined period of time (e.g., 30 us).

In the second settling phase following the first settling phase, the measuring circuit 222 instructs the ADPLL 100 to make the DCO 108 operated in the closed loop, and make the capacitors in the capacitor arrays 201 and 202 fixed. In addition, the measuring circuit 222 further instructs the ADPLL 100 to make the frequency divider 110 operated under an adjusted frequency divisor $N_{DIV}+\Delta N_{mmd}$ different from the frequency divisor $N_{DIV}$ used in the preceding first settling phase. For example, the pre-calculated amount $\Delta N_{mmd}$ added to the frequency divisor $N_{DIV}$ may be set by $K_{DCO\_est}/F_{REF}$ (i.e., $\Delta N_{mmd}=K_{DCO\_est}/F_{REF}$), where $K_{DCO\_est}$ is the frequency dependent initial guess of the DCO gain $K_{DCO}$, and $F_{REF}$ is the reference clock frequency (e.g., the frequency of the reference clock fed into the TDC 102). As shown in FIG. 13, the number of enabled capacitors in the capacitor array 201 is frozen at the end of the first settling phase, and one of capacitors in the capacitor array 202 is disabled. That is, regarding the capacitor array 202, a target capacitor to be measured is disabled in the second settling phase. As one integer capacitor in the capacitor array 202 is disabled and the frequency divisor is changed to $N_{DIV}+\Delta N_{mmd}$, the number of fractional capacitors (i.e., capacitors in the capacitor array 203) would be adjusted under the closed loop control to make the DCO frequency locked to the target value. In other words, in the second settling phase, the capacitor array 203 is adjusted/settled to keep the DCO frequency locked. Similarly, at the end of the second settling phase, a second characteristic value derived from the digital control word (i.e., the filter output LF_OUT) adaptively adjusted in the second settling phase is recorded. As mentioned above, the capacitor array 203 is controlled by the SDM output TRK_FRAC. Hence, the number of enabled capacitors in the capacitor array 202 is continuously changed due to sigma-delta modulation. In other words, the filter output LF_OUT is not fixed during the second settling phase. Similarly, the second characteristic value may be an average of values of the filter output LF_OUT over a predetermined period of time (e.g., 30 us).

After the first characteristic value and the second characteristic value are obtained, the measuring circuit 222 follows the aforementioned equation (3) to calculate a difference value Δlf_out between the first characteristic value and the second characteristic value. It should be noted that the setting of the frequency divisor in the second setting phase is different from the setting of the frequency divisor in the first setting phase. Hence, the difference value Δlf_out cannot be equated with the capacitor mismatch (i.e., the $K_{DCO}$ mismatch) of the measured capacitor. In this embodiment, the measuring circuit 222 performs additional calculation based on the difference value Δlf_out and accordingly obtains a calculation value Δlf_out', where the calculation value Δlf_out' is indicative of the capacitor mismatch (i.e., the $K_{DCO}$ mismatch) of the measured capacitor (i.e., the capacitor of the capacitor array 202 that is disabled in the second settling phase) in terms of the fractional capacitor unit size. The calculation value Δlf_out' may be derived from the following equation.

$$\Delta lf\_out' = \frac{F_{REF} * \Delta N_{mmd}}{1 + \Delta lf\_out} \quad (29)$$

To put it simply, regarding this alternative mismatch measurement design, one measurement operation performed by the measuring circuit 222 includes at least the following steps: in a first settling phase, controlling a first capacitor array of the DCO to have a first capacitive value consistently, wherein a second capacitor array of the DCO is controlled in a closed loop to make a frequency of the DCO locked to a target value, the first capacitor array is responsive to an integer part of a digital control word, and the second capacitor array is responsive to a fractional part of the digital control word; in a second settling phase, using a pre-calculated amount to adjust a frequency divisor used by a frequency divider located at a feedback path, and controlling the first capacitor array to have a second capacitive value consistently, wherein the second capacitor array is controlled in the closed loop to make the frequency of the DCO locked to the target value, and the second capacitive value is different from the first capacitive value; and calculating a calculation value based on a reference clock frequency, the pre-calculated amount and a difference value between a first characteristic value and a second characteristic value, wherein the first characteristic value is derived from the digital control word adaptively adjusted in the first settling phase, and the second characteristic value is derived from the digital control word adaptively adjusted in the second settling phase.

The above-mentioned measurement operation is sequentially applied to all capacitors included in the capacitor array 202. Specifically, if the capacitor array 202 has N capacitors included therein, the measuring circuit 222 obtains N difference values by sequentially performing N aforementioned measurement operation. In this embodiment, N=127. Hence, 127 different calculation values Δlf_out'[0]-Δlf_out'[126] are sequentially obtained, as shown in FIG. 14.

It should be noted that the same concept of changing the frequency divisor in the second settling phase may also be employed to modify the exemplary measurement design shown in FIG. 11/FIG. 12. Similarly, the same equation (29) can be used to obtain calculation values corresponding to the difference values Δlf_out[0]-Δlf_out[3] shown in FIG. 11/FIG. 12. These alternative designs all fall within the scope of the present invention.

Briefly summarized, in a case where the measurement apparatus 114 is configured to employ a mismatch measurement scheme with a frequency divisor which is not adjusted by a pre-calculated amount in the second setting phase (e.g., the exemplary mismatch measurement scheme shown in FIG. 3), the difference values (e.g., Δlf_out[0]-Δlf_out[126]) are indicative of the capacitor mismatches (i.e., the $K_{DCO}$ mismatches) of the measured capacitors, respectively. Hence, the measurement apparatus 114 directly utilizes and outputs the difference values as estimation values, and the compensation apparatus 116 refers to the estimation values (e.g., Δlf_out [0]-Δlf_out[126]) to perform the aforementioned compensation operations.

In another case where the measurement apparatus 114 is configured to employ a mismatch measurement scheme with a frequency divisor which is adjusted by a pre-calculated amount in the second setting phase (e.g., the exemplary mismatch measurement scheme shown in FIG. 13), the calculation values (e.g., Δlf_out'[0]-Δlf_out'[126]), derived from the difference values (e.g., Δlf_out[0]-Δlf_out[126]), are indicative of the capacitor mismatches (i.e., the $K_{DCO}$ mismatches) of the measured capacitors, respectively. Hence, the measurement apparatus 114 outputs the calculation values as estimation values, and the compensation apparatus 116 refers to the estimation values (e.g., Δlf_out'[0]-Δlf_out'D 261) to perform the aforementioned compensation operations. In other words, since the calculation values are generated to serve as the estimation values needed by the compensation apparatus 116, the calculation values, instead of the difference values, are processed by the aforementioned compensation operations shown in FIGS. 5-7. The same objective of measuring and compensating mismatches (e.g., capacitor mismatch and systematic mismatch) in the DCO is achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for dealing with mismatches in a digitally-controlled oscillator (DCO), comprising:
   performing at least one measurement operation, each comprising:
      in a first settling phase, controlling a first capacitor array of the DCO to have a first capacitive value consistently, and controlling a second capacitor array of the DCO in a closed loop to make a frequency of the DCO locked to a target value, wherein the first capacitor array is responsive to an integer part of a digital control word, and the second capacitor array is responsive to a fractional part of the digital control word;
      in a second settling phase, controlling the first capacitor array to have a second capacitive value consistently, and controlling the second capacitor array in the closed loop to make the frequency of the DCO locked to the target value, wherein the second capacitive value is different from the first capacitive value; and
      deriving an estimation value from a difference value between a first characteristic value and a second characteristic value, wherein the first characteristic value is derived from the digital control word adaptively adjusted in the first settling phase, and the second characteristic value is derived from the digital control word adaptively adjusted in the second settling phase; and
   estimating the mismatches according to at least the estimation value generated from the at least one measurement operation.

2. The method of claim 1, wherein the first capacitor array is a thermometer coded capacitor array; the step of controlling the first capacitor array of the DCO to have the first capacitive value comprises: consistently enabling a first predetermined number of capacitors in the first capacitor array; the step of controlling the first capacitor array of the DCO to have the second capacitive value comprises: consistently enabling a second predetermined number of capacitors in the first capacitor array; and a difference between the second predetermined number and the first predetermined number is equal to one.

3. The method of claim 2, wherein a plurality of measurement operations are performed for a plurality of capacitors in the first capacitor array, respectively; and regarding each of the capacitors in the first capacitor array, the capacitor is enabled in one of the first settling phase and the second settling phase, while disabled in the other of the first settling phase and the second settling phase.

4. The method of claim 1, wherein the first capacitor array is a binary coded capacitor array; the step of controlling the first capacitor array of the DCO to have the first capacitive value comprises: consistently enabling first selected capacitors in the first capacitor array; the step of controlling the first capacitor array of the DCO to have the second capacitive value comprises: consistently enabling second selected capacitors in the first capacitor array; and a difference between an accumulated capacitive value of the first selected capacitors and an accumulated capacitive value of the second selected capacitors corresponds to a capacitive value of a smallest capacitor in the first capacitor array.

5. The method of claim 4, wherein a plurality of measurement operations are performed for different combinations of first selected capacitors and second selected capacitors in the first capacitor array, respectively.

6. The method of claim 5, wherein the measurement operations include at least one measurement operation having an accumulated capacitive value of first selected capacitors greater than an accumulated capacitive value of second selected capacitors, and at least one measurement operation having an accumulated capacitive value of first selected capacitors smaller than an accumulated capacitive value of second selected capacitors.

7. The method of claim 1, further comprising:
   determining a first compensation value according to the estimated mismatches and a specific integer part of the digital control word; and
   adjusting a specific fractional part of the digital control word according to the first compensation value and a second compensation value such that an accumulated capacitor mismatch of selected capacitors in the first capacitor array that are enabled according to the specific integer part is compensated due to the first compensation value, and a systematic mismatch between capacitors in the first capacitor array and capacitors in the second capacitor array is compensated due to the second compensation value.

8. The method of claim 7, further comprising:
   checking if a predetermined criterion is satisfied; and
   when the predetermined criterion is satisfied, increasing the specific fractional part by an adjustment value, and decreasing the specific integer part by the adjustment value, wherein the first compensation value is determined according to the decreased integer part, and the increased fractional part is adjusted according to the first compensation value and the second compensation value.

9. The method of claim 8, wherein the predetermined criterion is satisfied when it is determined that the specific fractional part becomes negative when compensated by a compensation amount corresponding the specific integer part.

10. The method of claim 1, further comprising:
receiving a control value derived from the fractional part;
performing a sigma-delta modulation (SDM) upon the control value to generate an SDM output; and
utilizing a dynamic element matching (DEM) circuit to transmit the SDM output to the second capacitor array of the DCO.

11. An apparatus for dealing with mismatches in a digitally-controlled oscillator (DCO), comprising:
a measurement apparatus, comprising:
a measuring circuit, arranged for performing at least one measurement operation, each comprising:
in a first settling phase, controlling a first capacitor array of the DCO to have a first capacitive value consistently, wherein a second capacitor array of the DCO is controlled in a closed loop to make a frequency of the DCO locked to a target value, the first capacitor array is responsive to an integer part of a digital control word, and the second capacitor array is responsive to a fractional part of the digital control word;
in a second settling phase, controlling the first capacitor array to have a second capacitive value consistently, wherein the second capacitor array is controlled in the closed loop to make the frequency of the DCO locked to the target value, and the second capacitive value is different from the first capacitive value; and
deriving an estimation value from a difference value between a first characteristic value and a second characteristic value, wherein the first characteristic value is derived from the digital control word adaptively adjusted in the first settling phase, and the second characteristic value is derived from the digital control word adaptively adjusted in the second settling phase; and
an estimating circuit, arranged for estimating the mismatches according to at least the estimation value generated from the at least one measurement operation performed by the measuring circuit.

12. The apparatus of claim 11, wherein the first capacitor array is a thermometer coded capacitor array; and the measuring circuit is arranged to consistently enable a first predetermined number of capacitors in the first capacitor array in the first settling phase, and consistently enable a second predetermined number of capacitors in the first capacitor array in the second settling phase, where a difference between the second predetermined number and the first predetermined number is equal to one.

13. The apparatus of claim 12, wherein the measuring circuit performs a plurality of measurement operations for a plurality of capacitors in the first capacitor array, respectively; and regarding each of the capacitors in the first capacitor array, the measuring circuit is arranged to make the capacitor enabled in one of the first settling phase and the second settling phase, and disabled in the other of the first settling phase and the second settling phase.

14. The apparatus of claim 11, wherein the first capacitor array is a binary coded capacitor array; and the measuring circuit is arranged to consistently enable first selected capacitors in the first capacitor array in the first settling phase, and consistently enable second selected capacitors in the first capacitor array in the second settling phase, where a difference between an accumulated capacitive value of the first selected capacitors and an accumulated capacitive value of the second selected capacitors corresponds to a capacitive value of a smallest capacitor in the first capacitor array.

15. The apparatus of claim 14, wherein the measuring circuit performs a plurality of measurement operations for different combinations of first selected capacitors and second selected capacitors in the first capacitor array, respectively.

16. The apparatus of claim 15, wherein the measurement operations include at least one measurement operation having an accumulated capacitive value of first selected capacitors greater than an accumulated capacitive value of second selected capacitors, and at least one measurement operation having an accumulated capacitive value of first selected capacitors smaller than an accumulated capacitive value of second selected capacitors.

17. The apparatus of claim 11, further comprising:
a compensation apparatus, comprising:
a processing circuit, arranged for determining a first compensation value according to the estimated mismatches and a specific integer part of the digital control word; and
a compensating circuit, arranged for adjusting a specific fractional part of the digital control word according to the first compensation value and a second compensation value such that an accumulated capacitor mismatch of selected capacitors in the first capacitor array that are enabled according to the specific integer part is compensated due to the first compensation value, and a systematic mismatch between capacitors in the first capacitor array and capacitors in the second capacitor array is compensated due to the second compensation value.

18. The apparatus of claim 17, wherein the compensation apparatus further comprises:
a checking circuit, arranged for checking if a predetermined criterion is satisfied; and
an adjusting circuit, arranged for increasing the specific fractional part by an adjustment value and decreasing the specific integer part by the adjustment value when the predetermined criterion is satisfied, wherein the processing circuit determines the first compensation value according to the decreased integer part, and the compensating circuit is arranged to adjust the increased fractional part according to the first compensation value and the second compensation value.

19. The apparatus of claim 18, wherein the checking circuit determines that the predetermined criterion is satisfied when the specific fractional part becomes negative when compensated by a compensation amount corresponding to the specific integer part.

20. The apparatus of claim 11, further comprising:
a digital peripheral apparatus of the DCO, comprising:
a sigma-delta modulator, arranged for receiving a control value derived from the fractional part, and performing a sigma-delta modulation (SDM) upon the control value to generate an SDM output; and
a dynamic element matching (DEM) circuit, arranged for transmitting the SDM output to the second capacitor array of the DCO.

* * * * *